United States Patent
Neukermans et al.

[11] Patent Number: 5,969,465
[45] Date of Patent: Oct. 19, 1999

[54] ADJUSTING OPERATING CHARACTERISTICS OF MICROMACHINED TORSIONAL OSCILLATORS

[75] Inventors: Armand P. Neukermans, Palo Alto; Timothy G. Slater, San Francisco; Philip Downing, Saratoga, all of Calif.

[73] Assignee: XROS, Inc., Mountain View, Calif.

[21] Appl. No.: 09/053,232

[22] Filed: Apr. 1, 1998

Related U.S. Application Data

[60] Provisional application No. 60/042,307, Apr. 1, 1997.

[51] Int. Cl.$^6$ .......................... H02K 33/00; G02B 26/08
[52] U.S. Cl. .......................... 310/333; 359/224; 359/199; 310/40 MM
[58] Field of Search .......................... 267/154; 248/901; 359/877, 878, 199, 223, 224, 226; 310/40 MM, 333, 36, 68 C

[56] References Cited

U.S. PATENT DOCUMENTS

| | | | |
|---|---|---|---|
| 3,614,677 | 10/1971 | Willinger | 333/71 |
| 3,917,966 | 11/1975 | Mizutani et al. | 310/25 |
| 4,421,381 | 12/1983 | Ueda et al. | 350/6.6 |
| 4,874,215 | 10/1989 | Montagu | 350/6.6 |
| 4,919,500 | 4/1990 | Paulsen | 350/6.6 |
| 5,097,354 | 3/1992 | Goto | 359/212 |
| 5,162,951 | 11/1992 | Sorce | 359/871 |
| 5,408,253 | 4/1995 | Iddan | 347/260 |
| 5,488,863 | 2/1996 | Mochida et al. | 73/504.16 |
| 5,543,956 | 8/1996 | Nakagawa et al. | 359/225 |
| 5,550,669 | 8/1996 | Patel | 359/224 |
| 5,629,790 | 5/1997 | Neukermans et al. | 359/198 |

*Primary Examiner*—Nestor Ramirez
*Assistant Examiner*—B. Mullins
*Attorney, Agent, or Firm*—Donald E. Schreiber

[57] ABSTRACT

An improved micromachined structure used for beam scanners, gyroscopes, etc. includes a reference member from which project a first pair of axially aligned torsion bars. A first dynamic member, coupled to and supported from the reference member by the torsion bars, oscillates in one-dimension about the torsion bar's axis. A second dynamic member may be supported from the first dynamic member by a second pair of axially aligned torsion bars for two-dimensional oscillation. The dynamic members respectively exhibit a plurality of vibrational modes each having a frequency and a Q. The improvement includes means for altering a characteristic of the dynamic member's frequency and Q. Coupling between dynamic members permits altering the second dynamic member's frequency and Q by techniques applied to the first dynamic member. Some techniques disclosed also increase oscillation amplitude or reduce driving voltage, and also increase mechanical ruggedness of the structure.

46 Claims, 12 Drawing Sheets

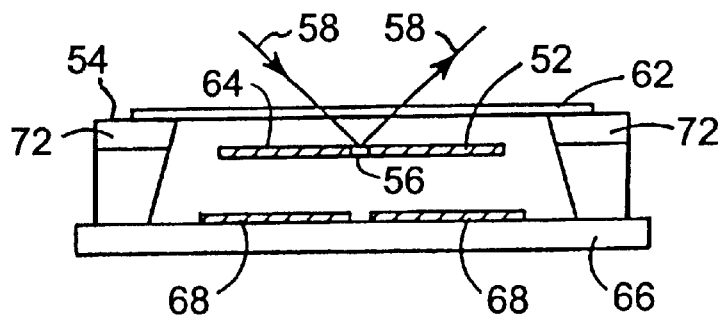
Fig._1
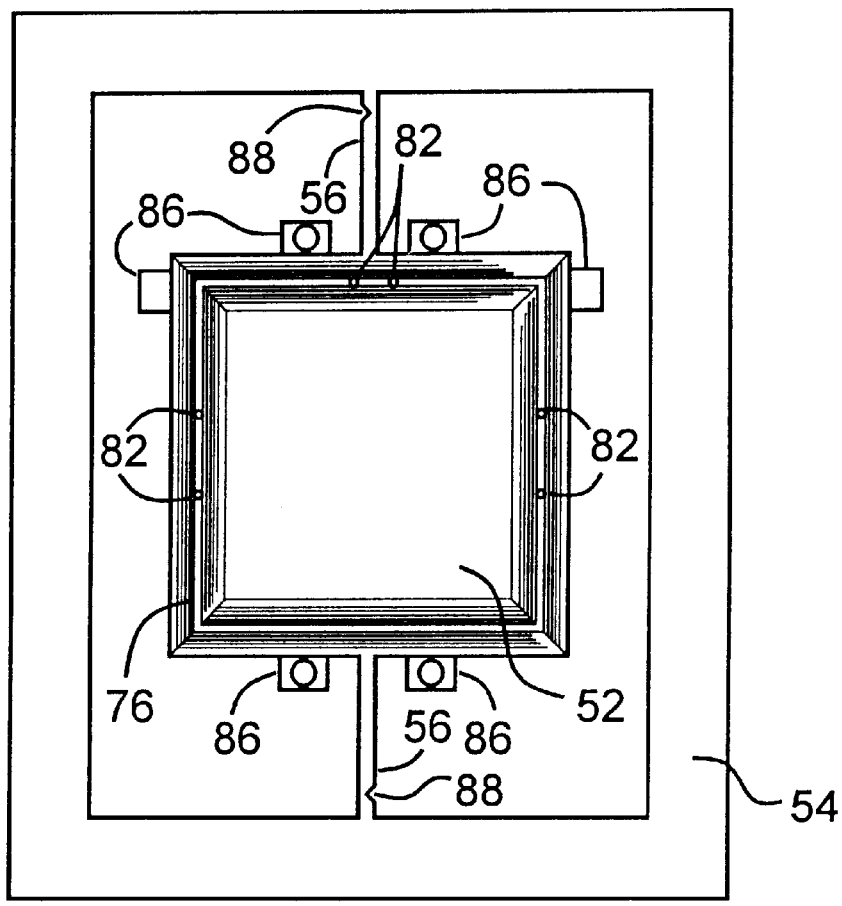
Fig._2

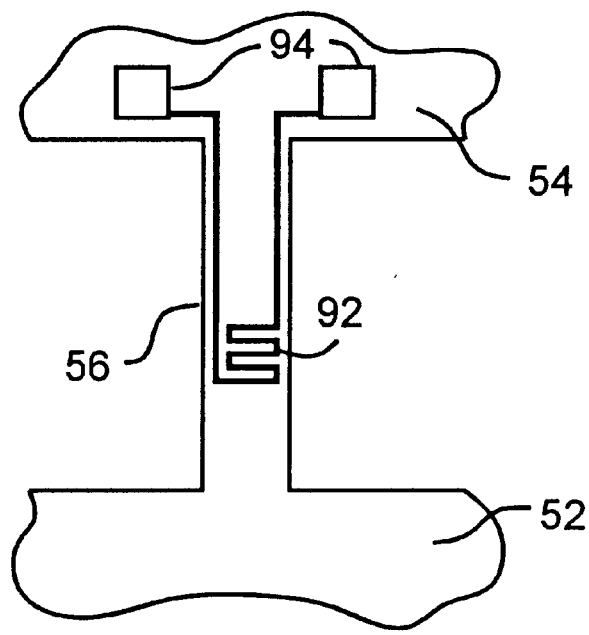
Fig._3
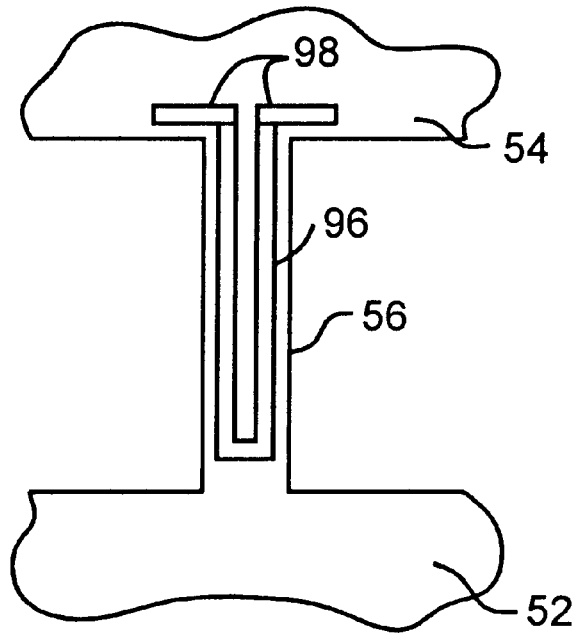
Fig._4

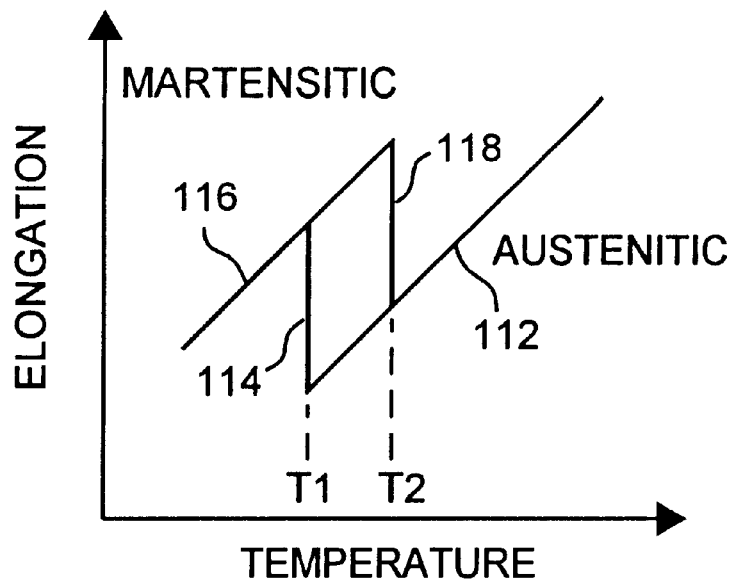
*Fig._ 6a*
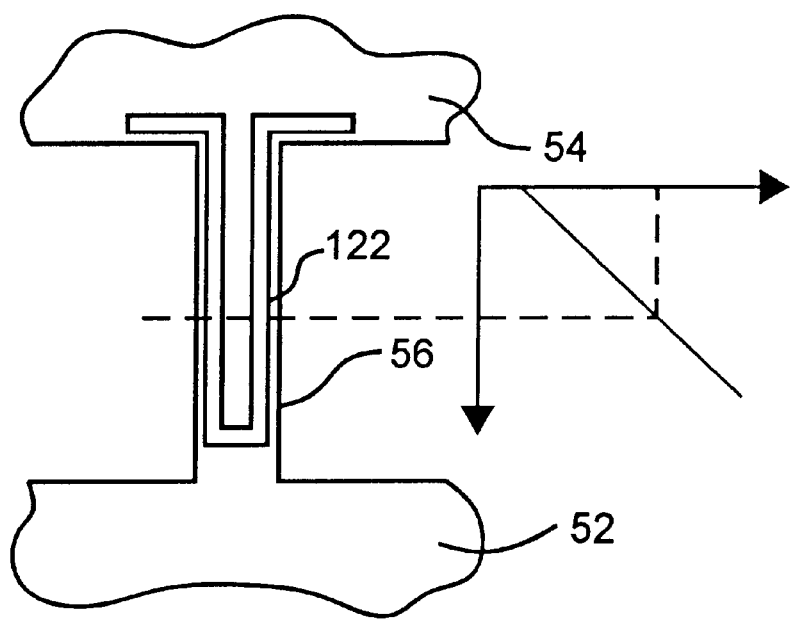
*Fig._ 6b*

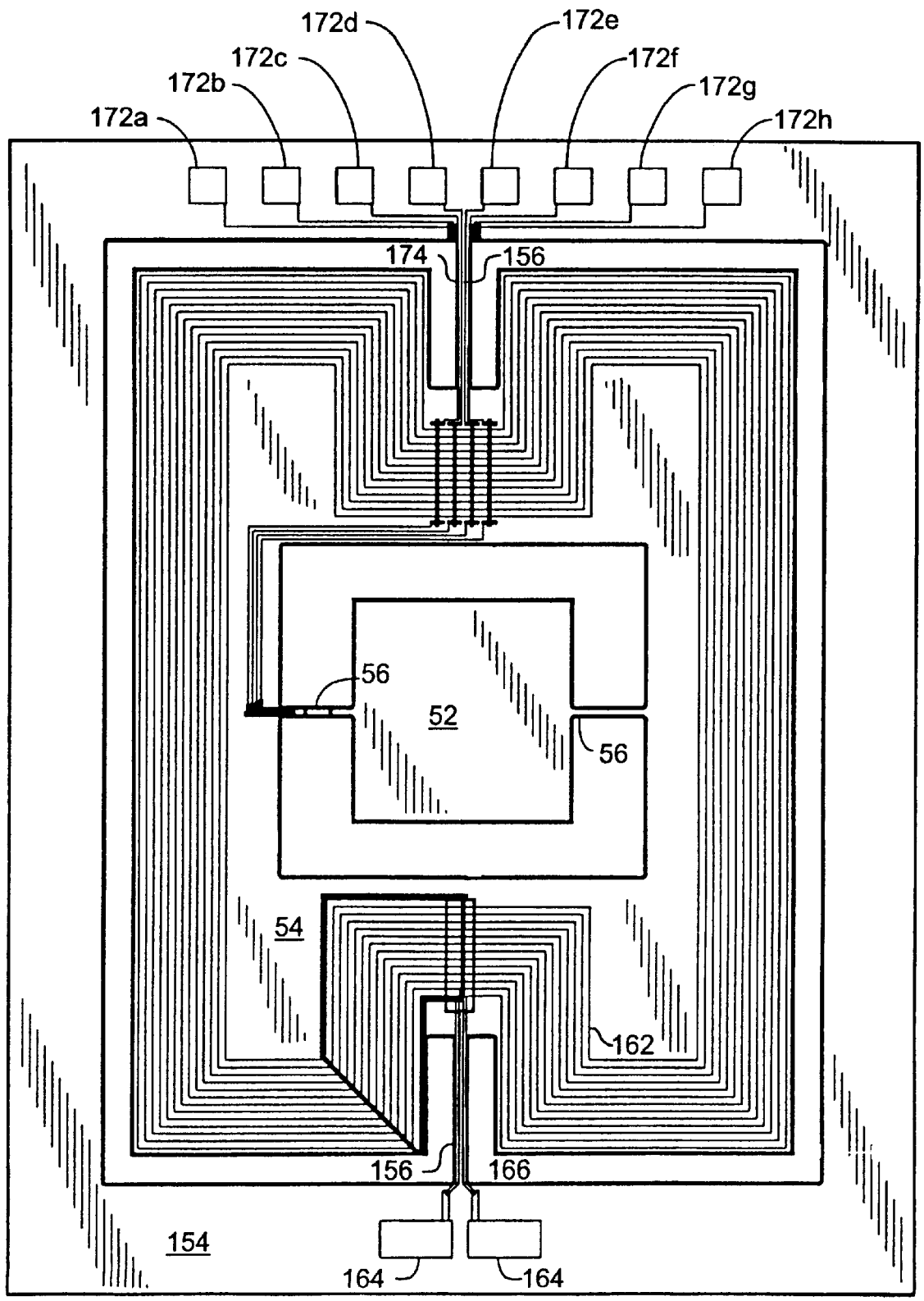
Fig. _9

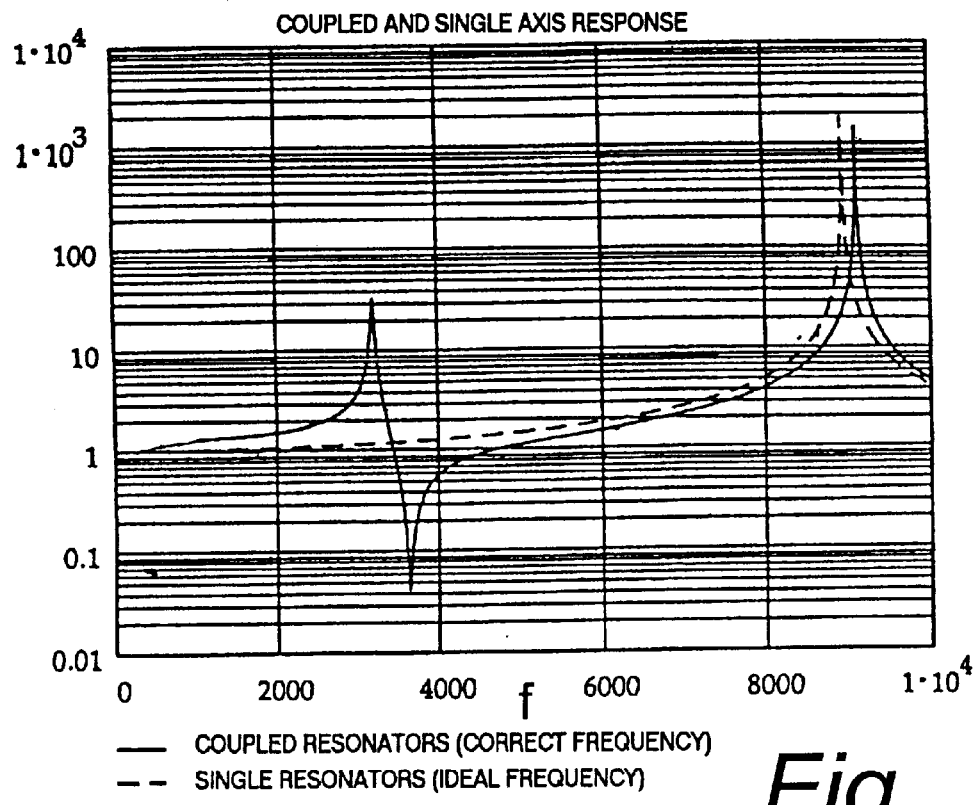
Fig. _ 10
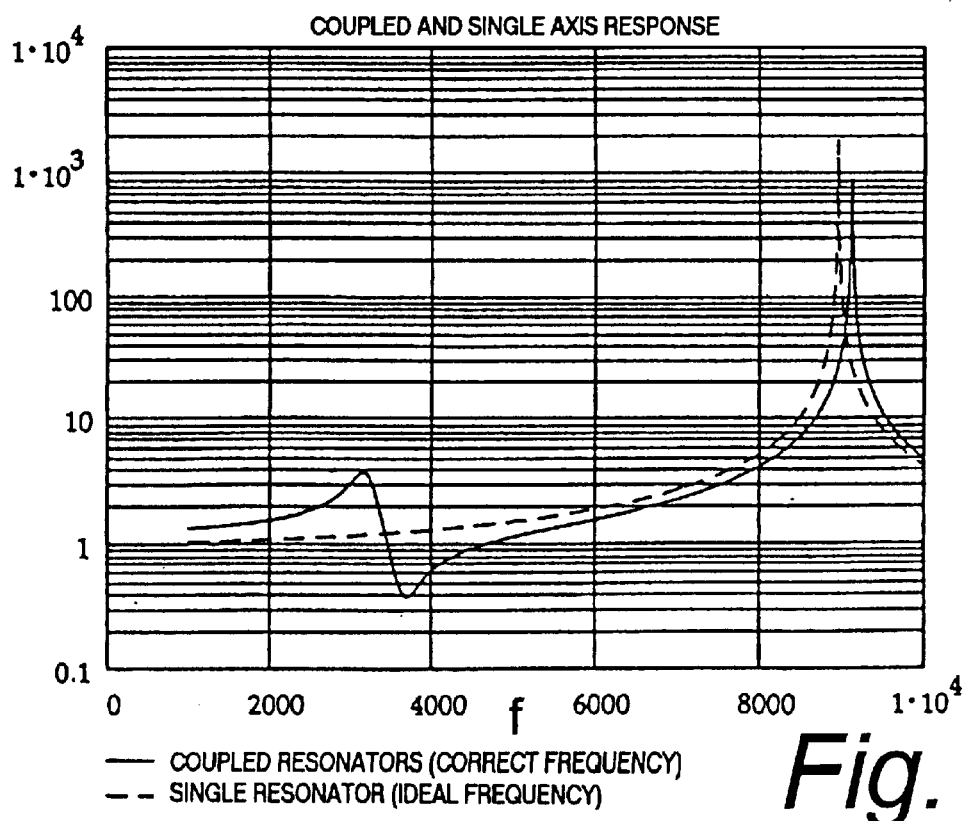
Fig. _ 11

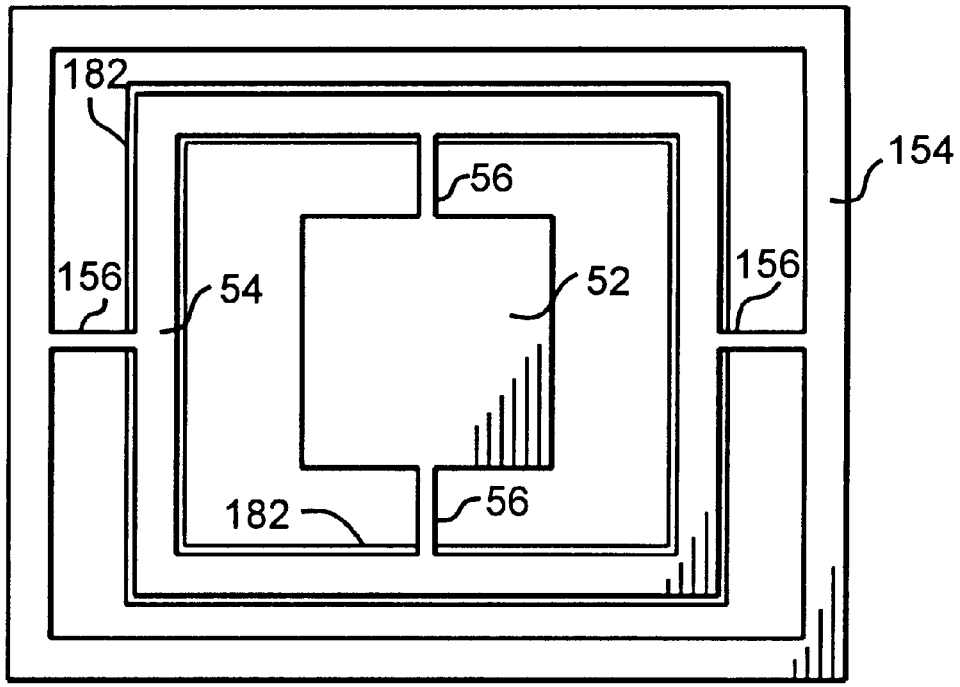
Fig. _12
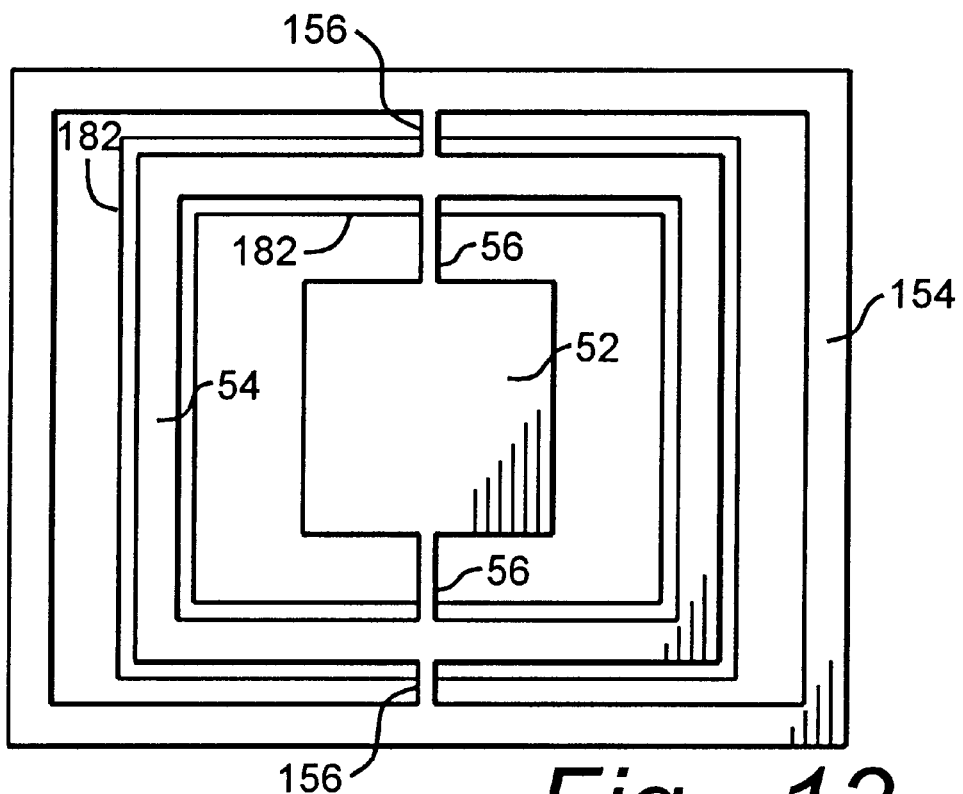
Fig. _13

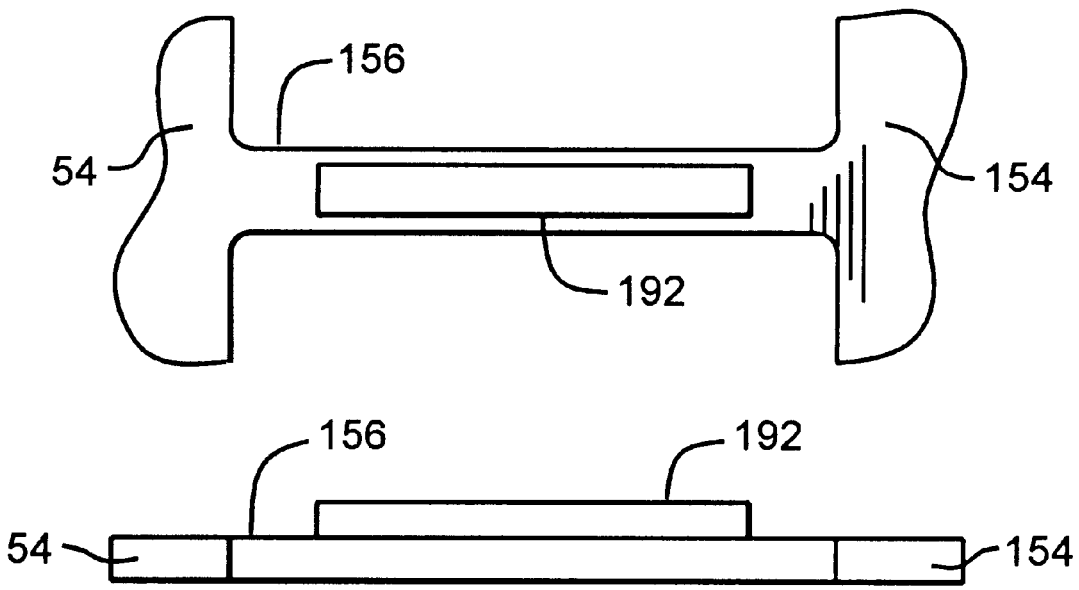
Fig._14a
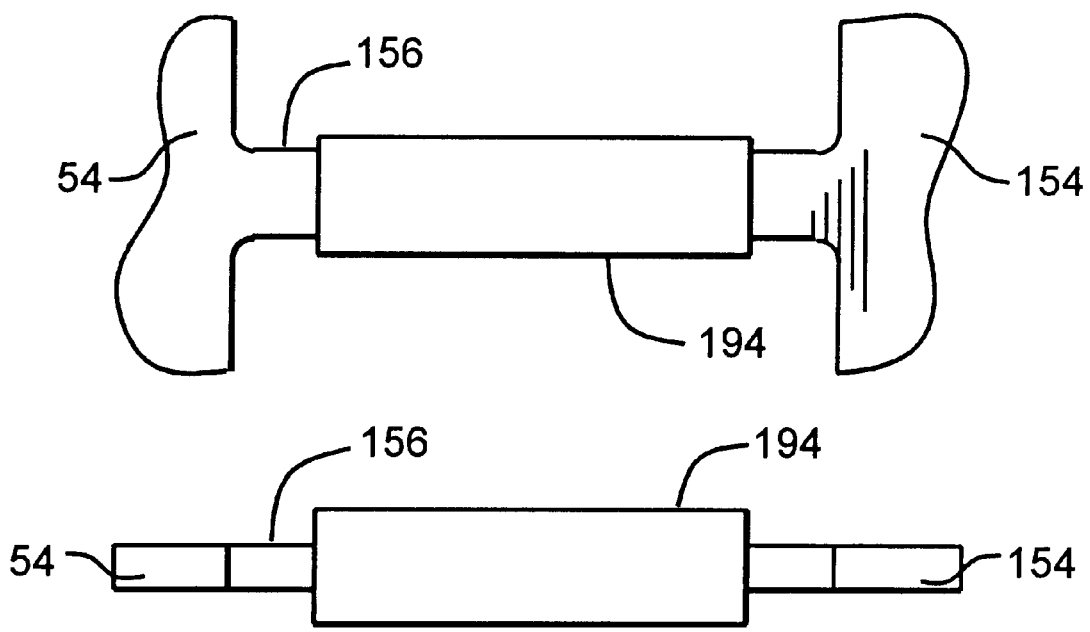
Fig._14b

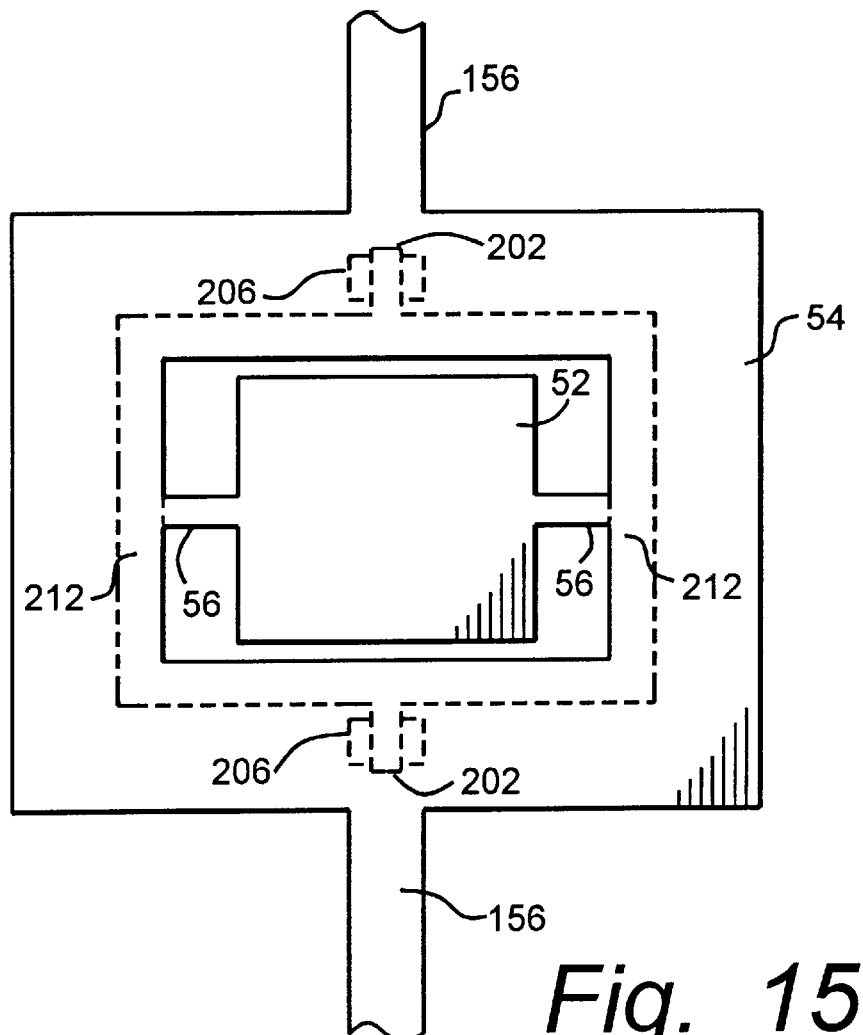
*Fig._15a*
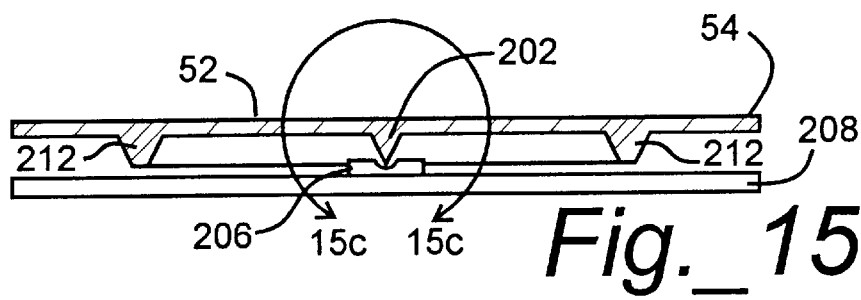
*Fig._15b*
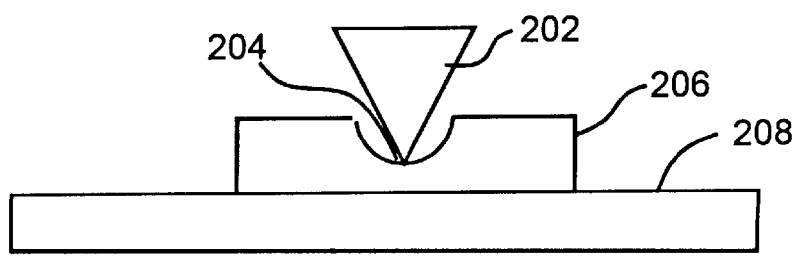
*Fig._15c*

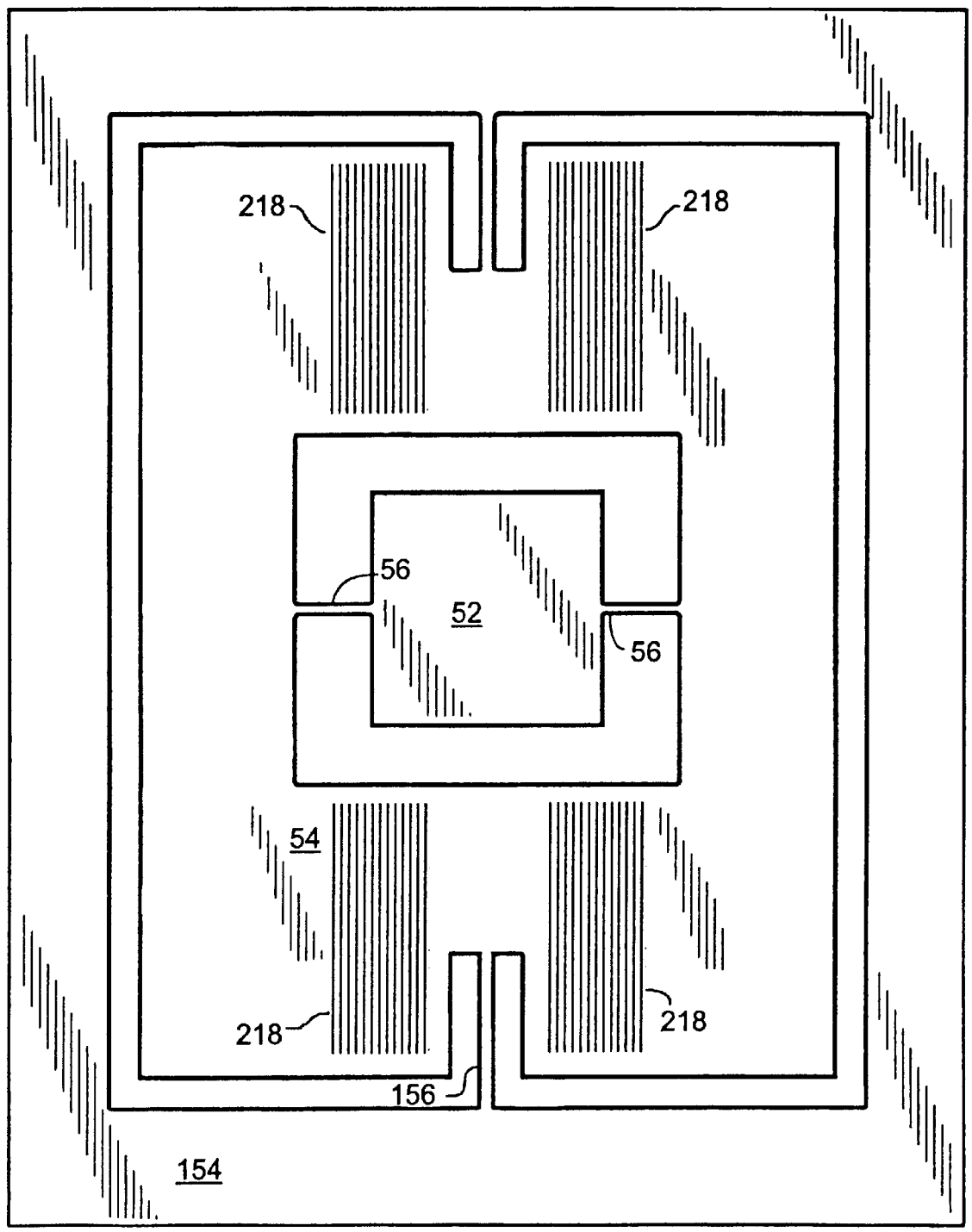
Fig._16

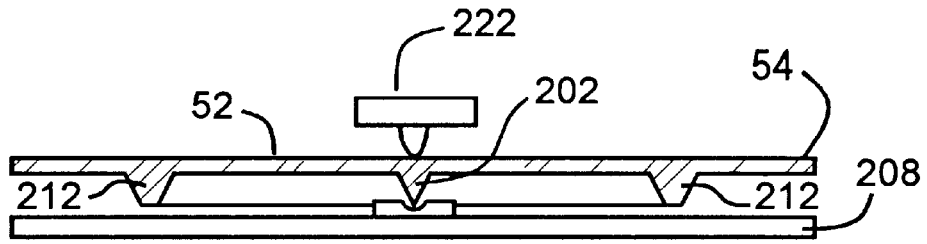
Fig. _17
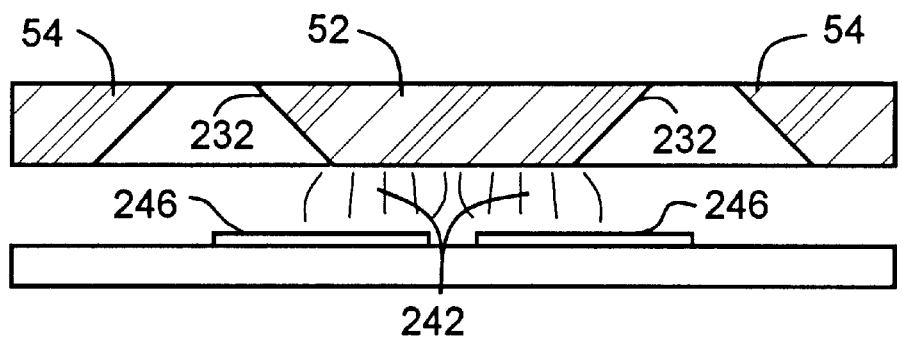
Fig. _18a
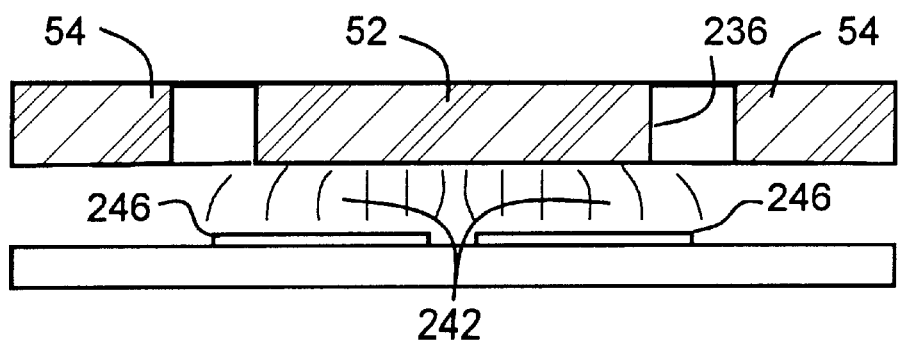
Fig. _18b

ADJUSTING OPERATING CHARACTERISTICS OF MICROMACHINED TORSIONAL OSCILLATORS

CLAIM OF PROVISIONAL APPLICATION RIGHTS

This application claims the benefit of U.S. Provisional Patent Application No. 60/042,307 filed on Apr. 1, 1997.

BACKGROUND OF THE INVENTION

1. Field of the Invention

The invention relates generally to micromachined structures and, more particularly, to micromachined structures in which a first frame is coupled to a plate or to a second frame by diametrically opposed torsion bars that permit rotation of the plate or second frame with respect to the first frame about a longitudinal axis of the torsion bars.

2. Description of the Prior Art

A micromachined structure in which a first frame is coupled to a plate or to a second frame by diametrically opposed torsion bars that permit rotation of the plate or second frame with respect to the first frame about a longitudinal axis of the torsion bars is useful for various different purposes. Practical uses for such micromachined structures include optical beam scanners, gyroscopes, flow meters, and profilometer and/or atomic force microscope ("AFM") heads, etc.

U.S. Pat. No. 5,629,790 entitled "Micromachined Torsional Scanner" that issued May 13, 1997, ("the Torsional Scanner patent") describes in detail torsional micro-scanners which may be used for optical beam scanning or beam deflection. Similar structures are also described in U.S. Pat. No. 5,488,863 entitled "Monolithic Silicon Rate-Gyro With Integrated Sensors" that issued Feb. 6, 1996 ("the Rate Gyro patent") for micromachined gyros. The Torsional Scanner patent and the Rate Gyro patent, which are incorporated herein by reference, both describe fabricating stress free plates yielding optically flat surfaces, and metrological grade torsional hinges that provide high quality torsional oscillators.

The Torsional Scanner patent and the Rate Gyro patent also describe incorporating torsion sensors into the torsional hinges, and the use of such torsion sensors to make the devices self oscillating at the devices inherent mechanical resonance frequency. In many applications, the mechanical resonance frequency provides a reference frequency from which other timing parameters are derived for a system that employs the torsional oscillator. By appropriately selecting parameters for the torsional oscillators, and then controlling such parameters during photo-lithographic fabrication, the resonance frequency can often be controlled to within a fraction of one percent of the chosen frequency. For many applications, his degree of frequency control and selection is adequate.

However for some applications such as display devices, it becomes necessary to match the resonance frequency of the torsional oscillator precisely to a predetermined external frequency. For example, the scanning mirror may be used in a display device, and needs to be synchronized exactly to an externally specified raster frequency. Since many of the oscillators that are envisioned for use in displays have a very high Q, it may be impossible to fabricate quantities of torsional oscillators having a specified resonance frequency with high yield. Similarly, for certain applications a micromachined torsional oscillator may exhibit an excessively high Q. Analogously, widespread commercial application of micromachined torsional scanners for display or imaging purposes also requires that the scanner itself be mechanical rugged, i.e. not fracture easily upon receiving an impact.

BRIEF SUMMARY OF THE INVENTION

An object of the present invention is to provide micromachined torsional oscillators whose resonant frequency may be adjusted.

Another object of the present invention is to provide micromachined torsional oscillators whose Q may be adjusted.

Yet another object of the present invention is to increase ruggedness of micromachined torsional oscillators.

Briefly the present invention is an improved integrated, micromachined structure adapted for use in optical beam scanners, gyroscopes, flow meters, and profilometer and/or atomic force microscope ("AFM") heads, etc. The improved structure includes a frame-shaped reference member from which project a first pair of diametrically opposed, axially aligned torsion bars. The improved structure also includes a first dynamic member which the torsion bars couple to and support from the reference member. The torsion bars support the first dynamic member for rotation about an axis that is collinear with the torsion bars. The reference member, the torsion bars and the dynamic member are all monolithically fabricated from a stress-free semiconductor layer of a silicon substrate. The dynamic member thus supported within the reference member by the torsion bars exhibits a plurality of vibrational modes including a principal torsional vibrational mode about the axis that is collinear with the torsion bars, a vertical shaking vibrational mode, a vertical rocking vibrational mode, a lateral shaking vibrational mode, and a lateral rocking vibrational mode. Each of the dynamic member's vibrational modes has characteristics including a vibrational frequency and a Q. The improved micromachined structure includes a first drive means for imparting oscillatory motion to the dynamic member about the axis that is collinear with the torsion bars.

The improved micromachined structure also includes means for altering a characteristic of the principal torsional vibrational mode and Q of the dynamic member. The means for altering a characteristic of the principal torsional vibrational mode and Q of the dynamic member permit, as needed for particular applications, tuning precisely the resonance frequency, and also methods to preserve, decrease or enhance the Q of the dynamic member. Techniques for tuning the resonance frequency include applying heat to the torsion bars, laser removal or etching of material from the dynamic member and/or torsion bars, generating stress in the torsion bars using memory alloys.

The improved micromachined structure in accordance with the present invention may also oscillate in two-dimension by inclusion of a second dynamic member that is supported from the first dynamic member by a second pair of diametrically opposed, axially aligned torsion bars. Such two-dimensional oscillatory structures typically include an inner dynamic member that oscillates at its resonant frequency and a synchronized outer dynamic member. In such a two dimensional oscillatory structure, the resonance frequency of the second dynamic member (which for most applications is a crucial characteristic), may be altered by changing a characteristic of the first dynamic member. In essence, the two dynamic members are coupled together, and act like a set of coupled resonators. Hence the resonance frequency of the principal torsional vibrational mode of the second dynamic member, is slightly affected by the characteristics of first dynamic member such as that member's resonance frequency and Q. This tuning technique, called coupled tuning, provides a number of advantages. For example tuning the resonance frequency of the dynamic member electrostatically is usually very desirable. Unfortunately, direct electrostatic tuning of resonance frequency usually changes the amplitude of oscillation. However, by electrostatically tuning the resonance frequency of the first dynamic member, one may change the resonance frequency of the second dynamic member without dramatically affecting the amplitude of its oscillation.

Techniques are also described for controlling the Q of the dynamic members (e.g. reduce the Q of a dynamic member until the response is almost critically damped), which is particularly desirable for the first dynamic member of a structure that oscillates in two-dimension. While decreasing the Q of the first dynamic member may be desirable for a particular application, it is generally desirable to have the Q on the second dynamic member as high as possible. Techniques for preserving the Q of the second dynamic member include clamping vibratory modes of the first dynamic member that absorb energy from the second dynamic member, and shaping the first dynamic member to preserve or even increase its Q. Some of the techniques disclosed also increase the oscillation amplitude or reduce the driving voltage required for a particular oscillation amplitude, and also increase the mechanical ruggedness of the improved micromachined structure.

These and other features, objects and advantages will be understood or apparent to those of ordinary skill in the art from the following detailed description of the preferred embodiment as illustrated in the various drawing figures.

BRIEF DESCRIPTION OF THE DRAWINGS

FIG. 1 is a partially sectioned elevational view depicting a torsional oscillator such as that disclosed in the Torsional Scanner patent;

FIG. 2 is a plan view depicting how an encircling frame and tabs may be fabricated around a periphery of the torsional oscillator to be removed during fabrication by laser cutting thereby tuning the oscillator resonance frequency;

FIG. 3 is a plan view illustrating a resistive heater as may be located on one or both of the torsional hinges for lowering the resonance frequency of the torsional oscillator;

FIG. 4 is a plan view illustrating of a resistive heater as may be diffused into one or both of the torsional hinges for lowering the resonance frequency of the torsional oscillator;

FIG. 6a is a phase transformation diagram for a memory alloy depicting a hysteresis loop exhibited by such materials;

FIG. 6b is a plan view illustrating a memory alloy structure as may be applied to one or both of the torsional hinges for lowering the resonance frequency of the torsional oscillator;

FIG. 9 is a plan view illustrating a typical biaxial, i.e. two-dimensional torsional scanner that employs resonant frequency drive for an inner torsional oscillator, and with a magnetic, subresonant frequency drive for a frame-shaped torsional oscillator that surrounds and supports the inner torsional oscillator;

FIGS. 10 and 11 are frequency response diagrams depicting characteristics for a pair of coupled torsional oscillators such as that depicted in FIG. 9;

FIG. 12 is a plan view illustrating a structure for electrostatically tuning the resonant frequency of the outer frame of a two-dimensional torsional scanner thereby altering the resonant frequency of the inner torsional oscillator;

FIG. 13 is a plan view illustrating how electrostatic tuning of the resonant frequency of a supporting frame may be used for adjusting the resonant frequency of a uniaxial, one-dimensional, torsional oscillator;

FIG. 14a depicts plan and elevational views illustrating how the Q of an outer torsional oscillator may be lowered by lithographically depositing a layer of material onto the torsional hinge supporting the outer frame;

FIG. 14b depicts plan and elevational views illustrating how other coatings may be applied onto the torsional hinge supporting the outer frame for lowering the torsional oscillator's Q;

FIGS. 15a–15c are plan and elevational views illustrating how a torsional oscillator's Q may be lowered by contacting the outer frame with a mechanical pivot;

FIG. 16 is a plan view, similar to the plan view of FIG. 9 illustrating how mass may be added to the outer frame of a typical two-dimensional scanner for lowering the resonance frequency of the rocking vibrational mode of the outer frame, thereby reducing coupling between the inner and outer torsional oscillators, and improving the Q of the inner torsional oscillator, while affecting very little the operating parameters of the outer torsional oscillator;

FIG. 17 is an elevational view illustrating how the resonance frequency of the outer torsional oscillator may be lowered by contacting the outer frame with a pivot, thereby restoring the Q of the inner torsional oscillator to nearly its theoretical maximum, and to reinforce the torsional hinges against impact; and FIGS. 18a and 18b are elevational views depicting alternative cross-sectional shapes for the torsional oscillator that will exhibit different Qs and response to an applied driving voltage.

DETAILED DESCRIPTION

Figure 5:
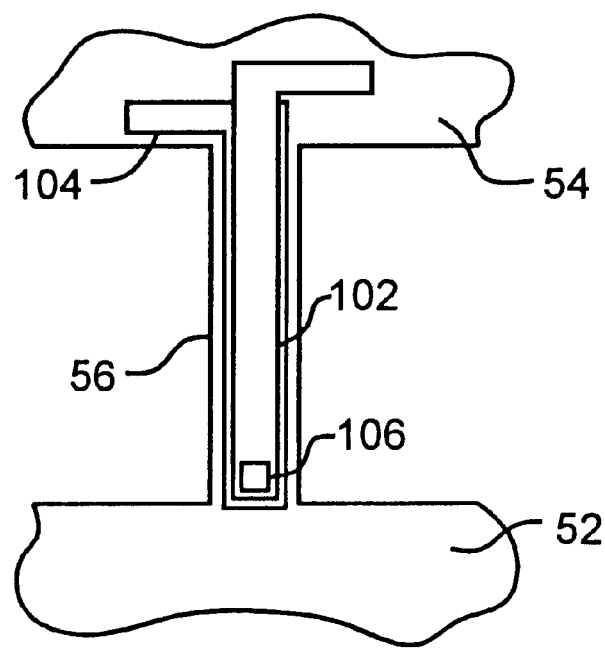
FIG. 5 is a plan view illustrating a bimetallic structure as may be applied to one or both of the torsional hinges for changing the resonance frequency of the torsional oscillator.

FIG. 1 depicts a first dynamic member torsional oscillator 52 such as that disclosed in the Torsional Scanner patent. The torsional oscillator 52 is supported from a surrounding reference member, i.e. a frame 54, by a pair of torsion bars 56, only one of which is visible in the illustration of FIG. 1. The torsion bars 56 respectively project outward from diametrically opposite sides of the torsional oscillator 52 to support the torsional oscillator 52 for rotation about an axis that is collinear with the torsion bars 56 in a principal torsional vibrational mode of the torsional oscillator 52. The vibrational modes of the torsional oscillator 52 and torsion bars 56 are designed so the vibrational frequency of the principal torsional vibrational mode of the torsional oscillator 52 is lower by at least 20% than the vibrational frequency of any other vibrational mode of the torsional oscillator 52. FIG. 1 specifically depicts use of the torsional oscillator 52 for an optical beam scanner in which a beam of light 58, illustrated by arrows in FIG. 1, passes through an optically transparent window 62 to impinge upon a reflecting front surface 64 of the torsional oscillator 52. As described in the Rate Gyro and Torsional Scanner patents and as depicted in FIG. 1, the frame 54 may be secured to a plate 66 having a pair of driving electrodes 68 formed on a surface thereof immediately adjacent to the torsional oscillator 52.

The torsional oscillator 52, frame 54 and torsion bars 56 are preferably formed in a layer 72 of SOI material, particularly if the torsional oscillator 52 must be very thin. Such a fabrication procedure produces stress free torsion bars 56 and torsional oscillator 52, and also provides very predictable resonance frequencies for various vibrational modes of the torsional oscillator 52 that are described in greater detail in the Torsional Scanner patent. In the normal mode of operation of the torsional oscillator 52, the resonance frequency of the principal torsional vibrational mode is determined by the inertia of the torsional oscillator 52, and by the torsional spring constant of the torsion bars 56. The torsional spring constant of the torsion bars 56 is determined by their length, width and thickness, and by the torsional modulus of silicon.

For many applications, it is extremely desirable to operate the torsional oscillator 52 at the resonant frequency of the principal torsional vibrational mode thus obtaining substantial angular excursions with minimal driving voltage (for electrostatic deflection) or current (for magnetic deflection). For most applications, the precise resonance frequency of the principal torsional vibrational mode is unimportant. In such instances operation at the resonance frequency of the principal torsional vibrational mode can be conveniently achieved using a feedback loop in a driving electronic circuit that includes a torsion sensor in one of the torsion bars 56, such as described both in the Torsional Scanner and in the Rate Gyro patents.

However, in other applications, the resonance frequency of the principal torsional vibrational mode needs to closely match an external reference frequency. Such a tuned torsional oscillator, locked to a precise external frequency may be used advantageously for display devices that require synchronization to an external clock frequency or raster. The Q of torsional oscillators 52, particularly torsion bars 56 having a high resonant frequency, may be extremely high (5000 or more). Under such circumstances, the external driving frequency and the natural resonance frequency of the principal torsional vibrational mode need to be very well matched to excite the torsional oscillator 52 at the external reference frequency. Matching the resonance frequency of the principal torsional vibrational mode to the torsional oscillator 52 with an external reference frequency is extremely difficult for a very high Q resonator because of the tolerances and variations resulting from the fabrication process, e.g. variations in the thickness of the torsional oscillator 52, and variations in the thickness and width of the torsion bars 56.

Passive Mechanical Tuning

Thus, for applications in which the resonance frequency of the principal torsional vibrational mode of the torsional oscillator 52 needs to closely match an external reference frequency, some form of resonant frequency and/or Q tuning become desirable. One technique for changing the resonance frequency is removing a small amount of material from the torsional oscillator 52. For example, material may be removed using an excimer laser from a face of the torsional oscillator 52, particularly the face of the torsional oscillator 52 opposite to the front surface 64. During such laser ablation, the torsional oscillator 52 may be exposed to reactive gases to accelerate the ablation process. This procedure is illustrated in FIG. 2 which depicts the surface of the torsional oscillator 52 opposite to the front surface 64 a being formed with a framed rim 76 that projects outward away from the front surface 64 and surrounds the remaining, thinner central portion of the torsional oscillator 52. (For some applications such as a gyro, the torsional oscillator 52 may consist simply of the framed rim 76.)

To employ the laser ablation technique for adjusting the resonance frequency of the torsional oscillator 52, the theoretical resonance frequency of the torsional oscillator 52, as initially fabricated using silicon micromachining techniques such as those described in the Torsional Scanner and Rate Gyro patents, is set slightly below that of the external reference frequency. Material may then be preferentially removed from the back of the framed rim 76, such as that depicted by cavities 82, so that the reflecting front surface 64 is not damaged by ablation debris. During the ablation procedure, the torsional oscillator 52 is driven at the external reference frequency, and the amplitude of its oscillation observed. The oscillation amplitude of the torsional oscillator 52 increases as removing mass from the framed rim 76 tunes the resonance frequency of the principal torsional vibrational mode toward the external reference frequency. In general, mass is preferably removed from the framed rim 76 symmetrically with respect to the longitudinal axis of the torsion bars 56. For gyros, material is ablated symmetrically with respect to the torsion bars 56 so as to maintain balance of the torsional oscillator 52. More precise tuning may be effected by removing mass from the framed rim 76 closer to the rotation axis established by the torsion bars 56. Tuning proceeds until the oscillation amplitude reaches a maximum at the external reference frequency.

Initial fabrication of the torsional oscillator 52 using silicon micromachining techniques may also produce tabs 86 about any of four (4) sides of the torsional oscillator 52 depicted in FIG. 2. During adjustment of the resonance frequency of the principal torsional vibrational mode in initial stages of tuning, one or more of the tabs 86 may be laser etched away, or even mechanically broken off. The tabs 86 are preferably formed with the same thickness as that of the torsion bars 56, and their areas and locations may be arranged to provide a pre-established decrease in the resonance frequency of the principal torsional vibrational mode (e.g. binary scaled). Alternatively, laser ablation may be applied to the torsion bars 56 themselves to effect the desired tuning such as by forming a notch 88 in one or both of the torsion bars 56.

Another way of effecting passive tuning of the resonance frequency of the principal torsional vibrational mode is depositing a memory alloy film, such as Ti—Ni (Nitinol), on at least one of the torsion bars 56. As illustrated in the phase transformation diagram for Nitinol of FIG. 6a, portions of a memory alloy film may be converted by thermal processing into different metallurgical phases.

Upon cooling from high temperature along a line 112 in FIG. 6a to a temperature T2, Nitinol exhibits a contraction coefficient of 11 ppm/° C. Along the line 112 of the phase diagram, Nitinol exists as a harder austenitic phase. Upon reaching the temperature T2 (around 80° C.), a phase change commences that converts Nitinol's hard austenitic phase material to a softer martensitic phase. Conversion to the martensitic phase during cooling of Nitinol at the temperature T2 along a line 114 causes Nitinol to expand significantly, i.e. up to 0.5% of its length. Linear expansion during Nitinol's phase transformation from the austenitic phase to the martensitic form may be as much as 2000 ppm, equivalent to expansion of the material over almost 200° C.

if the phase change did not occur. After Nitinol completes its conversion to the martensite phase, further cooling below T2 along a line 116 in FIG. 6a, Nitinol exhibits the martensitic contraction (expansion) coefficient of 6 ppm/° C. Nitinol's martensitic phase has an elastic modulus which is 2 to 3 times lower than the austenitic elastic modulus, and the martensitic phase's yield strength is from 3 to 5 times less than the austenitic phase.

Heating Nitinol along the line 112 from below the martensitic transition temperature T2 produces an expansion of the material up to a temperature T1 (about 90° C.). Heating of the material at T1 along a line 118 commences conversion of Nitinol's softer martensitic phase material to the harder austenitic phase. Conversion to the austenitic phase during heating of Nitinol at the temperature T1 causes Nitinol to contract significantly, i.e. up to 0.5% of its length. The temperature hysteresis in Nitinol's phase change cycle is approximately of 10–20° C., but can be larger.

The elongation or shrinkage of Nitinol may be used advantageously to provide compressive or tensile stresses in the torsion bars 56 for tuning. After evaporation or sputtering of the Ti—Ni film, it is subsequently annealed at 400–450 C. to develop the hard austenitic phase. Cooling to the martensitic (soft) phase below T2 releases most of the stresses developed during annealing. By judiciously heating a torsion bar 56 that has a memory alloy film 122 applied thereto with a temperature profile along the length of the torsion bar 56 such as that depicted in FIG. 6b converts part of the memory alloy film 122 on the torsion bar 56 that is heated to a temperature higher than T1 back into the austenitic phase. As described above, conversion of the Nitinol memory alloy from the martensitic phase to the austentitic phase causes substantial shrinkage in the converted portion of the memory alloy film 122. In this way, stresses applied to the torsion bar 56 may be controlled, by controlling the amount of the memory alloy film 122 on the torsion bar 56 that is converted back into the austenitic phase.

Figure 7:
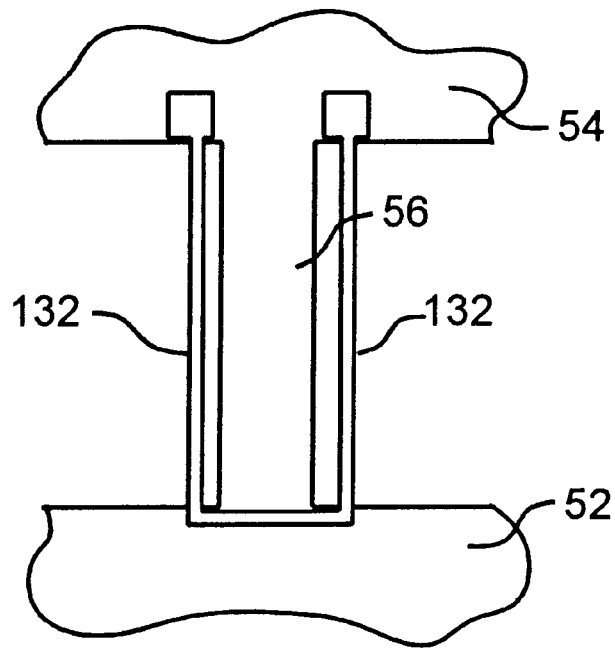
FIG. 7 is a plan view illustrating a trifilar or a bifilar structure as may be applied to one or both of the torsional hinges for controlling their stiffness.

Alternatively, as illustrated in FIG. 7, freestanding along one or both sides thereof. The torsion bar 56 supporting the torsional oscillator 52 now becomes effectively trifilar (or bifilar for a single band 132). By controlling the amount of tension in the memory alloy film band 132 as described above, the principal torsional vibrational mode of the torsional oscillator 52 may be tuned to different frequencies. Because the bands 132 are thin, metal stress and fatigue are negligible.

The preceding mechanical tuning techniques provide for passive tuning, but cannot compensate for changes in the resonance frequency of the principal torsional vibrational mode which occur during operation of the torsional oscillator 52.

Active Thermal Tuning

It has also been experimentally observed that the resonance frequency of the principal torsional vibrational mode may also be actively tuned and tracked by applying heat in various different ways to the torsion bars 56. In general, heating applies compressive stress to the torsion bars 56 since heating expands them between the nominally fixed frame 54. Application of such compressive stress makes the torsion bar 56 more pliable in torsion, since during rotation of the torsional oscillator 52 heating reduces elongation of elemental fibers making up the torsion bar 56. Furthermore, application of heat lowers the elastic modulus of the silicon forming the torsion bars 56. Hence, applying heat typically lowers the resonance frequency of the principal torsional vibrational mode of the torsional oscillator 52.

Tuning the resonance frequency of the principal torsional vibrational mode of the torsional oscillator 52 may then be effected as follows. The theoretical resonance frequency of the torsional oscillator 52, as initially fabricated using silicon micromachining techniques such as those described in the Torsional Scanner and Rate Gyro patents, is set slightly above that of the external reference frequency for the torsion bars 56 being at room temperature. The torsional oscillator 52 is then driven at the external reference frequency, and the amplitude of its oscillation observed. Heat is then applied to the torsion bars 56. raising its temperature as much as 100° C., until the amplitude reaches a maximum for a fixed drive voltage or current. Heat may be applied to one hinge, or to both, to obtain the desired degree of frequency matching. To minimize thermal interaction, heat is preferably be applied to only one of the torsion bars 56, with the torsion sensor, such as that described in the Torsional Scanner and Rate Gyro patents, being located in the other torsion bar 56.

Heat may be applied to the torsion bar 56 in various different ways. For example, as depicted in FIG. 3 a small metallic heater 92 having electrical contacts 94 may be fabricated on a surface of at least one of the torsion bars 56. The heater 92 may be made of Nichrome, and is preferably located halfway between the torsional oscillator 52 and the frame 54 to minimize heat losses. Alternatively and preferably, a resistor 96 having electrical contacts 98 may be diffused into the surface of silicon forming the torsion bar 56 and frame 54 as depicted in FIG. 4. Use of the resistor 96 diffused into the silicon requires no metal along the torsion bar 56 thereby avoiding a possibility of metal fatigue such as could occur with the heater 92. Doping of the silicon may be arranged so that most electrical power dissipation occurs near the center of the torsion bar 56. If needed, electrical leads connecting either to the heater 92 or to the resistor 96 may cross one of the torsion bars 56, be coupled to the heater 92 or to the resistor 96 by a suitable metallic conductor on the torsional oscillator 52 to reduce electrical power dissipation, and then leave the heater 92 or the resistor 96 via the other torsion bar 56. Under such circumstances, a torsional sensor located in one of the torsion bars 56 must be compensated for temperature if its output signal is to be used as an accurate measurements of angular deflection of the torsional oscillator 52.

Active tuning may also be provided through thermally activated bimetallic structures (such as Ni or Ti, TiNi or other metals on silicon). Such structures apply stress to the corresponding torsion bar 56 because of differential thermal expansion between the metal and the underlying silicon forming the torsion bar 56. As illustrated in FIG. 5, a first lead 102, formed from a metal such as Ti, Ni and typically at least a few microns thick for effective operation, is positioned over the silicon torsion bar 56. A second lead 104 is diffused into the underlying silicon of the torsion bar 56 to provide most of the electrical resistance. The first and second leads 102 and 104 connect together at a contact 106. Heating of the bimetal first lead 102 now produces tensile stresses in the silicon forming the torsion bar 56 because the first lead 102 has a coefficient of thermal expansion which differs from the coefficient of thermal expansion of the silicon forming the torsion bar 56.

Referring again to FIG. 7, the structure for tuning of the principal torsional vibrational mode of the torsional oscillator 52 depicted there can also be used with conventional metal bands 132. Electrically heating the bands 132 during operation of the torsional oscillator 52 alters the length of the bands 132. Because the metal bands 132 are freestanding, the amount of electrical power needed for heating is small, and the silicon torsion bar 56, which may now include the torsion sensor disclosed in the Torsional Scanner and Rate Gyro patents, is not heated. Heating the metal bands 132 with an electric current applied through electrical contacts 134 reduces tension in the bands 132, and correspondingly reduces the effective torsional constant of the torsion bar 56. The metal bands 132, regardless of the material used for their fabrication, may be supported by thin etched ribbons of silicon, if so desired.

Active Piezoelectric Tuning

Figure 8:
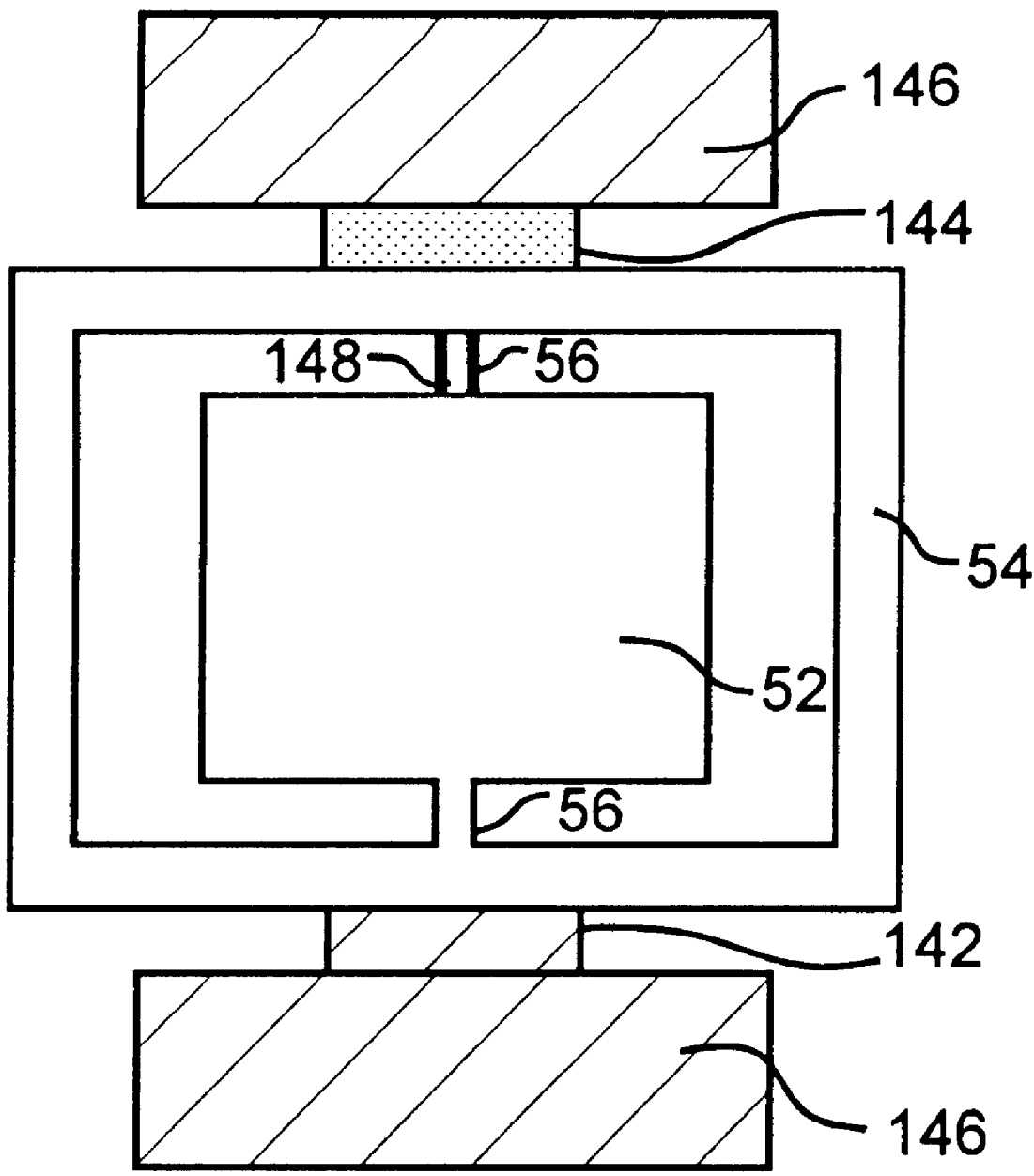
FIG. 8 is a plan view illustrates application of a piezo electric actuator for altering stress in a torsional oscillator's hinge.

FIG. 8 depicts a structure for effecting active piezoelectric tuning of the principal torsional vibrational mode of the torsional oscillator 52. As described above, the torsional oscillator 52 is supported by torsion bars 56 that extend between the torsional oscillator 52 and the frame 54. For active piezoelectric tuning, the frame 54 is itself disposed between an anvil 142 and a piezo-electric or magneto-restrictive actuator 144, which themselves are mechanically supported between stops 146. The anvil 142, actuator 144, and the stops 146 are preferably disposed collinearly with the torsion bars 56. The actuator 144 can also be attached to the frame 54 to either push or pull on the frame 54. Application of a voltage to the piezoelectric or magneto-strictive actuator 144 alters the stress in the torsion bars 56, thereby altering the resonance frequency of the principal torsional vibrational mode of the torsional oscillator 52. In addition to altering the stress in the torsion bars 56 by application of a voltage to the actuator 144, mechanical pre-stress may also be applied to the structure depicted in FIG. 8 as desired.

Analogously, a piezoelectric film 148, e.g. ZnO or CdS, may be applied to at least one of the torsion bars 56. Applying a voltage to the film 148 likewise alters in stress of the torsion bar 56, thereby changing the resonance frequency of the principal torsional vibrational mode of the torsional oscillator 52.

Active Electrostatic Frequency Tuning

Electrostatic tuning of torsional resonators has been described in the literature. Application of a DC electrostatic bias to the torsional resonator effectively lowers its spring constant, and hence the resonance frequency of the torsional resonator. However, for very high resonant frequencies only a small amount of frequency tuning can be realized with electrostatic tuning applied directly to the torsional oscillator 52. For such devices only a small amount of tuning can be obtained electrostatically because the mechanical spring constant is high and the torsional oscillator 52 is tiny. Consequently, only a small electrostatic force can be applied directly to the torsional oscillator 52. However, of even greater significance is the amplitude effect of the DC electrostatic bias. A large DC electrostatic bias applied to the torsional oscillator 52 drastically affects the amplitude of oscillation which impedes simultaneous amplitude and frequency control of the torsional oscillator 52.

However, for a two dimensional torsional oscillator 52 such as that depicted in FIG. 9 in which the frame 54 is itself a torsional oscillator, altering the resonance frequency of the principal torsional vibrational mode of the frame 54 which supports the torsional oscillator 52 in turn alters the resonance frequency of the principal torsional vibrational mode of the torsional oscillator 52.

In the illustration of FIG. 9, the butterfly-shaped frame 54 is itself supported from a surrounding reference member, i.e. an outer frame 154, by a pair of torsion bars 156 that are oriented orthogonally to the torsion bars 56. The torsion bars 156 support the frame 54 for rotation about an axis that is collinear with the torsion bars 156 in a principal torsional vibrational mode of the frame 54. The non-parallel orientation of the torsion bars 56 and the torsion bars 156 permits concurrent motion of the torsional oscillator 52 in two directions. Similar to the torsional oscillator 52 and the torsion bars 56, the frame 54 and the torsion bars 156 are also designed so the vibrational frequency of the principal torsional vibrational mode of the frame 54 is lower by at least 20% than the vibrational frequency of any other vibrational mode of the frame 54.

Similar to the torsional oscillator 52 illustrated in FIG. 1, rotation of the torsional oscillator 52 about the axis of the torsion bars 56 is preferably driven electrostatically. As depicted in FIG. 9, a coil 162 plated onto the frame 54 encircles its periphery. A pair of electrical contacts 164, located on the outer frame 154, connect to the coil 162 via leads 166 which are brought into the frame 54 over one of the torsion bars 156. An electrical current of tens of milli-amperes ("mA") coupled into the coil 162 through the electrical contacts 164 combined with a magnetic field established by magnets (not illustrated in FIG. 9) disposed on opposite sides of the outer frame 154 rotates the frame 54 several degrees with respect to the outer frame 154 about the axis of the torsion bars 156.

FIG. 9 also depicts electrical contacts 172a–h that are connected by leads 174 to torsion sensors of a type disclosed in the Torsional Scanner and Rate Gyro patent applications. The torsion sensors are respectively incorporated into one of the torsion bars 56 and into one of the torsion bars 156.

The butterfly shape depicted in FIG. 9 increases the mass of the frame 54 while concurrently permitting both long torsion bars 156 and providing a large moment of inertia without increasing the area occupied on the silicon substrate during manufacturing. Hence, using the butterfly shape for the frame 54, or even for the torsional oscillator 52, yields more micromachined structures from a silicon substrate and the manufacturing cost per micromachined structure correspondingly decreases.

For two dimensional torsional oscillator 52 (as illustrated in FIG. 9), the resonance frequency of the torsional oscillator 52 may be changed by changing a characteristic of the resonance frequency of the frame 54, particularly its rocking vibrational mode that is described in greater detain in the Torsional Scanner patent. In essence, the torsion bars 56 coupling the torsional oscillator 52 to the frame 54 make them into a pair of coupled oscillators. Consequently, the resonance frequency of the principal torsional vibrational mode of the torsional oscillator 52 is affected by the characteristics of frame 54. More specifically, the rocking vibrational mode resonance interacts with the resonance frequency of the principal torsional vibrational mode of the torsional oscillator 52. Operation of the torsional oscillator 52 and the frame 54 can be analyzed as coupled oscillators. Such an analysis indicates that, in most instances, the effect of coupling the torsional oscillator 52 with the moving frame 54 generally increases the resonance frequency of the principal torsional vibrational mode of the torsional oscillator 52. Thus, by lowering the resonance frequency of the rocking vibrational mode of the frame 54, either by increasing the inertia of the frame 54 with respect to rocking movement, or by lowering the effective spring constant of the torsion bars 156, the resonance frequency of the principal torsional vibrational mode of the torsional oscillator 52 also decreases to approach its theoretical value for an uncoupled torsional oscillator.

FIGS. 10 and 11 are frequency response diagrams that depict shifting of the resonance frequency of the principal torsional vibrational mode of the torsional oscillator 52 and decrease in Q which occurs if the torsional oscillator 52 is supported from the frame 54 which can rock, such as the frame 54 depicted in FIG. 9. The dashed lines in FIGS. 10 and 11 respectively illustrate the ideal frequency response of the principal torsional vibrational mode of the torsional oscillator 52. The solid lines illustrate the ideal frequency response of the principal torsional vibrational mode of the torsional oscillator 52 if it is supported from the frame 54 which can rotate as depicted in FIG. 9. The left-most peak and valley in the solid line curves in FIGS. 10 and 11 occur at the resonance frequency of the rocking vibrational mode of the rotatable frame 54. As graphically depicted in FIGS. 10 and 11, supporting the torsional oscillator 52 from a rotatable frame 54 lowers the Q of the torsional oscillator 52 due to coupling between the principal torsional vibrational mode of the torsional oscillator 52 and the rocking vibrational mode of the rotatable frame 54. FIGS. 10 and 11 also graphically depict that supporting the torsional oscillator 52 from a rotatable frame 54 increases the resonance frequency of the principal torsional vibrational mode of the torsional oscillator 52 because the rotatable frame 54 rocks in opposition to rotation of the torsional oscillator 52, thereby providing an apparent increase in the stiffness of the torsion bars 56. The frequency response diagrams of FIGS. 10 and 11 respectively illustrate operation that may be expected for a two-dimensional scanner which in FIG. 10 the rotatable frame 54 has a Q of 100 for the rocking vibrational mode, and in FIG. 11 the rotatable frame 54 has a Q of 10 for the rocking vibrational mode.

Lowering the resonance frequency of the rocking vibrational mode of the rotatable frame 54 correspondingly decreases the resonance frequency of the principal torsional vibrational mode of the torsional oscillator 52. FIG. 12 illustrates how this phenomena may be exploited for actively tuning the resonance frequency of the principal torsional vibrational mode of the torsional oscillator 52. The two-dimensional torsional scanner depicted in FIG. 12 includes an electrostatic tuning plate 182 that is disposed adjacent to the rotatable frame 54. Application of a voltage between the frame 54 and the electrostatic tuning plate 182 tunes the rocking vibrational mode of the rotatable frame 54. (Application of a voltage between the frame 54 and the electrostatic tuning plate 182 also affects to some degree the resonance frequency of the principal torsional vibrational mode of the frame 54. However, since the principal torsional vibrational mode of the frame 54 is not coupled to the principal torsional vibrational mode of the torsional oscillator 52, and since for most applications the frame 54 is driven far below the principal torsional vibrational mode, the effect of applying a voltage between the frame 54 and the electrostatic tuning plate 182 on operation of the frame 54 is negligible.) Because the outer torsion bars 156 are much more flexible than the inner torsion bar 56 and because the area of the surrounding frame 54 is comparatively large, electrostatic attraction between the frame 54 and the electrostatic tuning plate 182 affects the resonance frequency of the frame 54 significantly. Because the rocking vibrational mode of the frame 54 is coupled to the principal torsional vibrational mode of the torsional oscillator 52, a change in the resonance frequency of the surrounding frame 54 will, to a lesser degree, affect the resonance frequency of the principal torsional vibrational mode of the torsional oscillator 52. However the oscillation amplitude of the inner torsional oscillator 52 is unaffected by electrostatically tuning the rocking mode resonance frequency of the surrounding frame 54.

The principle of electrostatic tuning of the resonance frequency of the principal torsional vibrational mode of the torsional oscillator 52 described above is also applicable to single axis torsional oscillators such as that depicted in FIG. 13. Such an electrostatically tuned single axis torsional oscillator 52 is supported by torsion bars 56 within the frame 54, that is itself supported within the outer frame 154 by the pair of torsion bars 156 which are aligned with the torsion bars 56. The torsional oscillator 52 is intended to scan by rotating only about the axis of torsion bars 56. The frame 54 and the torsion bars 156 provide a coupled oscillator having the same torsional axis as the torsional oscillator 52. Both the torsional oscillator 52 and the frame 54 are designed to be very high Q oscillators. The frame 54 is generally designed with a lower resonance frequency for its principal torsional vibrational mode. The resonance frequency of the principal torsional vibrational mode of the frame 54 may then be tuned, e.g. electrostatically by applying a voltage between the frame 54 and the electrostatic tuning plate 182. Tuning the resonance frequency of the torsional mode of the frame 54 in turn affects the resonance frequency of the torsional mode of the torsional oscillator 52. Since the frame 54 moves very little at the resonance frequency of the torsional mode of the torsional oscillator 52, the electrostatic tuning plate 182 may be positioned much closer to the frame 54 than for the structure depicted in FIG. 12. Such coupled electrostatic tuning only mildly affects the amplitude of oscillations of the torsional oscillator 52.

Passive Q Tuning

Thus far only techniques for altering the resonance frequency of the principal torsional vibrational mode of the torsional oscillator 52 have been discussed. For certain applications it is also very highly desirable to control the Q of rotatable torsional oscillator 52 and frame 54. Particularly for two-dimensional scanners it is sometimes advantageous to dampen oscillation of the frame 54. While the torsional oscillator 52 generally oscillates with as high a Q as possible, the frame 54 is typically driven in servo mode at a frequency well below the resonance frequency of its torsional mode, for which a high Q is undesirable. In fact, such operation of the rotatable frame 54 preferably employs a Q closer to critical damping. Altering the Q of the frame 54 can be achieved in various ways. Although the techniques to be described are applied to the rotatable frame 54, they may in general also be applied to the torsional oscillator 52.

FIG. 14a illustrates the torsion bar 156 on which layer 192 of a polymeric material has been deposited. Depositing the layer 192 may be done by lithographic patterning a material such as polyimide, photoresist or other damping materials over the torsion bar 156. The length, width and thickness of the polymeric layer 192 may be tailored to provide a desired amount of damping. Other lossy materials which provide high damping such as lead may also be deposited and patterned similarly to that described above for polymeric materials.

Alternatively, FIG. 14b the torsion bar 156 may be enclosed within a glob 194 of polymeric material or wax. The glob 194 is produced by depositing a small drop of polymeric material or wax while in solution or suspension onto the torsion bar 156 using a syringe, pipette or any appropriate method dispensing a known quantity. After the solvent carrying the polymeric material or wax evaporates, the glob 194 dampens oscillations of the frame 54. Polymeric materials used for the glob 194 may be loaded with appropriate high loss materials such as lead or other metals. Alternatively, high loss polymers are also known in the trade (e.g. Blue Goo) which may be applied to the torsion bar 156. Adding such damping materials also strengthens the outer torsion bar 156, while at the same time making the torsion bar 156 more ductile and shock resistant.

Mechanical support may also be provided for the rotatable frame 54 which, in addition, will lower the Q of the frame 54. To lower the moment of inertia of the rotatable frame 54, the frame 54 is frequently made as thin as, or only slightly greater than, the torsion bars 156 except for a reinforcing frame 212 that encircles the torsional oscillator 52, and that projects outward from one surface of the frame 54 to stiffen the frame 54. Fabricated in this way, the rotatable frame 54 is advantageous because it is then extremely light, and exhibits a low Q because the frame 54 caries only the coil 162. FIGS. 15a through 15c depict the rotatable frame 54 including etched V-shaped ridges 202 that are aligned with the axis of rotation of the frame 54 established by the torsion bars 156, and that project outward from a surface of the frame 54. The ridges 202 are respectively received into a semi-circularly shaped troughs 204, best illustrated in the enlargement of FIG. 15c, that are formed into immediately adjacent bearing blocks 206 of a support plate 208. The ridges 202 are pushed with a slight preload into contact with the troughs 204 that are formed into the bearing blocks 206. The troughs 204 may be overcoated with an elastomeric material such as polyimide. Contact area between the ridges 202 and the troughs 204 may be limited to only a few points at each of the ridges 202 if so desired, either by patterning the trough 204 or the ridge 202 itself. In the illustration of FIGS. 15a–15c, the torsion bars 156 are left untouched and free-standing. Mechanical contact between the ridges 202 and the troughs 204 lowers the Q substantially, but does not impede the rotational movement of the frame 54 about the axis established by the torsion bars 156. By forming the trough 204 with a rounded V-shape, the bearing blocks 206 also restrain lateral movement of the frame 54. Restraining lateral movement of the frame 54 has other substantial advantages to be described in greater detail below. This is to be contrasted with the disclosure of K. Peterson, Proc. IEEE, vol. 70, no. 5, p. 61, May 1982 ("the Peterson article"). See also U.S. Pat. No. 4,317,611 to K. Peterson. As disclosed above, the ridges 202 and the troughs 204 are deliberately added to the frame 54 to decrease Q of the rotatable frame 54, rather than to enhance it.

The techniques described above lower the Q of the frame 54, but in most instances it is also necessary to preserve the high Q of the torsional oscillator 52. Inertial forces of the oscillating torsional oscillator 52 apply a transverse torque on the torsion bars 156. Hence rotation of the torsional oscillator 52 couples directly into the rocking mode of the frame 54. Energy from the torsional oscillator 52 can therefore be coupled via the torsion bar 56 to the frame 54. As described above, the frame 54 generally is designed with a substantially lower Q. The net result is that energy of the torsional oscillator 52 is dissipated on the frame 54, which effectively lowers the Q of the torsional oscillator 52. Consequently, inappropriately decreasing the Q of the frame 54 may degrade the Q of the torsional oscillator 52. Hence minimizing "rocking mode" movement of the rotatable frame 54 at the frequency of the principal torsional vibrational mode preserves and may even increase the Q of the torsional oscillator 52.

To minimize coupling between the principal torsional vibrational mode of the torsional oscillator 52 and the rocking vibrational mode of the frame 54, the rocking vibrational mode resonance frequency of the frame 54 should be separated as far as practicable from the principal torsional vibrational mode of the torsional oscillator 52. This may be achieved in various ways such as reducing the cross-sectional area of the torsion bars 156. Unfortunately, reducing the cross-sectional area of the torsion bars 156 exacerbates reliability and breakage problems. Likewise, increasing the inertia of the frame 54 lowers its resonance frequency, but may affect its performance and reliability. To maintain or even increase the Q of the torsional oscillator 52, it is desirable to increase the moment of inertia of the frame 54 in the rocking mode, while affecting very little the moment of inertia of the frame 54 along the axis established by the torsion bars 156. This may be achieved by adding mass to the frame 54 as depicted in FIG. 16. Mass may be added to the frame 54 in the form of etched silicon ridges 218 located close to or on the axis of rotation of the frame 54 such that the moment of inertia for the rocking vibrational mode increases while insignificantly increasing the moment of inertia (or weight) of the frame 54 about the axis of rotation established by the torsion bar 156. As described previously, to lower the weight and inertia of the rotatable frame 54, the frame 54 normally consists of only a very thin sheet carrying the coil 162, perhaps reinforced by the reinforcing frame 212. If the resonant frequencies of the principal torsional vibrational mode of the torsional oscillator 52 and the rocking vibrational mode of the frame 54 are widely separated, by adding mass as illustrated in FIG. 16 the moment of inertia for the rocking vibrational mode of the frame 54 may be typically increased by a factor of three (3), thereby correspondingly reducing excursions of rocking vibrational mode movement and energy loss from the principal torsional vibrational mode of the torsional oscillator 52, and also effectively increasing the Q of the torsional oscillator 52.

Another way of effectively adding mass to the frame 54 close to the axis of rotation established by the torsion bars 156 is to effectively mechanically clamp excursions of the frame 54 in the rocking vibrational mode, while leaving the frame 54 free in the principal torsional vibrational mode. Such clamping of the frame 54 may be effected in a way similar to that described above for lowering the Q of the frame 54. As depicted in FIG. 17, the frame 54 may be clamped vertically along its axis of rotation, from either side or both. The sharp ridge 202 or protrusions on the frame 54 (easily formed by etching along the 110 direction of silicon) contact the bearing block 206 located on the bearing block 206 along the axis of rotation established by the torsion bars 156. By applying pre-strain in the vertical direction from the support plate 208, such contact effectively clamps the frame 54 in the vertical direction, while leaving the frame 54 free to rotate about the axis of rotation established by the torsion bars 156. In this configuration, the torsion bars 156 are partially pre-stressed, thereby effectively clamping the rocking vibrational mode of the frame 54. Another support 222, suitably rounded, may be applied to the other side of the frame 54. Application of the support 222 to the frame 54 effectively makes infinite the moment of inertia for the rocking vibrational mode of the frame 54. This configuration for clamping the rocking vibrational mode of the frame 54, the Q of the torsional oscillator 52 may approach that which would be obtained if the frame 54 were fixed.

Particularly for high frequency operation, the Q of the torsional oscillator 52 may be increased by rounding and streamlining where practicable all moving parts on the torsional oscillator 52 to reduce air friction. Correspondingly, for the torsional oscillator 52 having a particular surface area, the Q may be increased by maximizing the inertia of the torsional oscillator 52. In this respect, the trapezoidal form of the torsional oscillator 52 having sloping sides 232 depicted in FIG. 18a, produced by etching silicon along the 110 direction and bounded by 111 planes on the sides, is not optimal, particularly when the thickness of the torsional oscillator 52 approaches the length and width of the torsional oscillator 52. The geometry of the torsional oscillator 52 depicted in FIG. 18a typically reduces the inertia of the torsional oscillator 52, while maintaining drag caused by the surface area of the torsional oscillator 52. Conversely, etching the silicon so the torsional oscillator 52 has vertical sides 236, as depicted in FIG. 18b, is much preferred, and can be readily accomplished by dry etching. In this respect, when using wet etching it is advantageous to etch the torsion bars 56 and the torsional oscillator 52 along the 100 direction of silicon thereby obtaining a rectangular rather than trapezoidal cross-section for the torsional oscillator 52. Alternatively, the torsion bars 56 may be oriented along the 110 direction of silicon using bonded wafers with the torsion bars 56 oriented along the 110 direction, and the "handle" layer oriented along the 100 direction. The torsional oscillator 52 having a rectangular cross-section as depicted in FIG. 18b, rather than the torsional oscillator 52 having the trapezoidal cross-section depicted in FIG. 18a, also provides a much larger field fringing area 242 between the torsional oscillator 52 and electrostatic driving plates 246, and consequently higher torque for the same driving voltage and plate separation. Thus the rectangular cross-section for the torsional oscillator 52 depicted in FIG. 18b substantially enhances the electrostatic driving force applied to the torsional oscillator 52 while exhibiting substantially the same air friction as the trapezoidal cross-section for the torsional oscillator 52 depicted in FIG. 18a. Accordingly, the rectangular cross-section for the torsional oscillator 52 provides increased inertia for the torsional oscillator 52 without increasing air friction, and thus provides an increased Q for the torsional oscillator 52.

As described in the Torsional Scanner patent, the Q of the torsional oscillator 52 may be improved by operating in vacuum. However, the Q may also be improved by operating in an enclosed atmosphere or a hermetic enclosure filled with a gas having lower viscosity than air such as hydrogen, propane, ethane, methane, butane etc. Finally, electrostatic breakdown between the torsional oscillator 52 and the electrostatic driving plates 246 ultimately limits the amount of force that may be applied to the torsional oscillator 52. Gases such as SF(, or any other electron capturing gas may be included in the enclosure to improve the breakdown voltage. Use of an electron capturing gas does not raise Q of the torsional oscillator 52 as such, but its use increases the allowable driving voltage, and hence the amplitude of the oscillation's.

The torsion bars 156 of a two dimensional scanner such as that depicted in FIGS. 9 and 16 is typically the most fragile since it is both long and slender to minimize dissipation in a magnetic drive for the torsional oscillator 52. In addition to increasing the Q of the torsional oscillator 52, the structures depicted in FIGS. 15a–c and 17 also increase protection for the torsion bars 156, by restricting movement of the frame 54. The trough 204 depicted in FIG. 15c effectively restricts movement of the frame 54 in the lateral and downward directions. The support 222 depicted in FIG. 17 located on top of the torsional oscillator 52 along the axis of rotation established by the torsion bars 156, either in contact or spaced a small distance (5–10 micron) from the torsional oscillator 52, similarly restrains the frame 54 from moving away from the support plate 208. In the configuration depicted in FIG. 17, the torsion bars 156 are not contacted by the bearing blocks 206 or the supports 222. This structure effectively restrains and buffers movement of the outer scanner, except for oscillation about the axis established by the torsion bars 156.

Furthermore, coating the bearing blocks 206 with a polymeric material as described above in connection with FIGS. 15b and 15c, already desirable for lowering the Q of the frame 54, also vastly increases the impact resistance of the torsion bars 156 while adding little resistance to rotation about the axis established by the torsion bars 156. Hence, by employing the structures depicted in FIGS. 15a–15c and 17 the torsion bars 156 are substantially protected from shocks. Alternatively, the same shock resistance may be maintained while using thinner, more flexible torsion bars 156, thereby reducing the power dissipation required to drive oscillation of the frame 54 magnetically.

Industrial Applicability

Although the preceding description of electrostatic tuning of the resonance frequency of the principal torsional vibrational mode of the torsional oscillator 52 has been presented for optical beam scanners, it is likewise applicable to a gyro such as that described in the Rate Gyro patent. In applying electrostatic tuning to the rate gyro, the gyro's sensing circuit may be designed to adjust slightly the resonance frequency of the principal torsional vibrational mode of the oscillating member, and thereby improving frequency alignment of the oscillating member with the sensing member.

Although the present invention has been described in terms of the presently preferred embodiment, it is to be understood that such disclosure is purely illustrative and is not to be interpreted as limiting. Consequently, without departing from the spirit and scope of the invention, various alterations, modifications, and/or alternative applications of the invention will, no doubt, be suggested to those skilled in the art after having read the preceding disclosure. Accordingly, it is intended that the following claims be interpreted as encompassing all alterations, modifications, or alternative applications as fall within the true spirit and scope of the invention.

What is claimed is:

1. In an integrated, micromachined structure that includes:

a frame-shaped reference member;

a pair of diametrically opposed, axially aligned torsion bars projecting from the reference member;

a dynamic member that is coupled by the torsion bars to the reference member to be thereby supported from the reference member for rotation about an axis of the torsion bars; the reference member, the torsion bars and the dynamic member all monolithically fabricated from a stress-free semiconductor layer of a silicon substrate; the dynamic member thus supported within the reference member by the torsion bars exhibiting a plurality of vibrational modes including a principal torsional vibrational mode about the axis of the torsion bars, a vertical shaking vibrational mode, a vertical rocking vibrational mode, a lateral shaking vibrational mode, and a lateral rocking vibrational mode, each such vibrational mode of the dynamic member having characteristics including a vibrational frequency and a Q; and drive means for imparting oscillatory motion to the dynamic member about the axis of the torsion bars;

wherein the improvement comprises:

characteristic adjusting means, included in at least one of the torsion bars, for tailoring a characteristic of the principal torsional vibrational mode of the dynamic member.

2. The micromachined structure of claim 1 wherein the characteristic adjusting means tailors the vibrational frequency of the principal torsional vibrational mode.

3. The micromachined structure of claim 2 wherein tailoring the vibrational frequency of the principal torsional vibrational mode is effected by removing material from the torsion bars that support the dynamic member.

4. The micromachined structure of claim 2 wherein tailoring the vibrational frequency of the principal torsional vibrational mode is effected by a memory alloy film applied to at least one of the torsion bars that support the dynamic member, the memory alloy film being processed to establish a controlled stress in the torsion bar.

5. The micromachined structure of claim 2 wherein a heater is formed on a surface of at least one of the torsion bars that support the dynamic member for tailoring the vibrational frequency of the principal torsional vibrational mode.

6. The micromachined structure of claim 2 wherein a resistor is diffused into silicon forming at least one of the torsion bars that support the dynamic member for tailoring the vibrational frequency of the principal torsional vibrational mode.

7. The micromachined structure of claim 2 wherein a resistor is diffused into silicon forming at least one of the torsion bars that support the dynamic member and a lead, formed from a material having a coefficient of thermal expansion which differs from that of silicon, is formed on a surface of that torsion bar for tailoring the vibrational frequency of the principal torsional vibrational mode.

8. The micromachined structure of claim 2 wherein tailoring the vibrational frequency of the principal torsional vibrational mode is effected by a piezoelectric film applied to at least one of the torsion bars, application of a voltage across said piezoelectric film controllably altering stress in the torsion bars.

9. The micromachined structure of claim 1 wherein the characteristic adjusting means tailors the Q of the principal torsional vibrational mode.

10. The micromachined structure of claim 9 wherein tailoring the Q is effected by applying a layer of a damping material to at least one of the torsion bars.

11. The micromachined structure of claim 10 wherein the damping material applied to at least one of the torsion bars is a polymeric material.

12. The micromachined structure of claim 10 wherein the damping material applied to at least one of the torsion bars is a lossy metallic material.

13. In an integrated, micromachined structure that includes:
a frame-shaped reference member;
a first pair of diametrically opposed, axially aligned torsion bars projecting from the reference member;
a first, frame-shaped first dynamic member that is coupled by the first torsion bars to the reference member to be thereby supported from the reference member for rotation about an axis of the first torsion bars;
a second pair of diametrically opposed, axially aligned torsion bars projecting from the first dynamic member;
a second dynamic member that is coupled by the second torsion bars to the first dynamic member to be thereby supported from the first dynamic member for rotation about an axis of the second torsion bars;
the reference member, the first and second torsion bars and the first and second dynamic members being all monolithically fabricated from a stress-free semiconductor layer of a silicon substrate; the first and second dynamic members thus supported within the reference member respectively by the first and second torsion bars each respectively exhibiting a plurality of vibrational modes including a principal torsional vibrational mode about the axis of the torsion bars, a vertical shaking vibrational mode, a vertical rocking vibrational mode, a lateral shaking vibrational mode, and a lateral rocking vibrational mode, each such vibrational mode of the dynamic member having characteristics including a vibrational frequency and a Q; and
drive means for imparting oscillatory motion to the second dynamic member about the axis of the second torsion bars;
wherein the improvement comprises:
characteristic adjusting means for tailoring a characteristic of the principal torsional vibrational mode of the second dynamic member by controlling a characteristic of the first dynamic member.

14. The micromachined structure of claim 13 wherein the characteristic adjusting means tailors the vibrational frequency of the principal torsional vibrational mode of the second dynamic member.

15. The micromachined structure of claim 14 wherein tailoring the vibrational frequency of the principal torsional vibrational mode is effected by an electrostatic tuning plate that is disposed adjacent to the rotatable first dynamic member, a voltage applied across the first dynamic member and the electrostatic tuning plate tailoring a characteristic of the principal torsional vibrational mode of the second dynamic member.

16. The micromachined structure of claim 15 wherein the axis of the first torsion bars is not aligned with the axis of the second torsion bars.

17. The micromachined structure of claim 15 wherein the axis of the first torsion bars is aligned with the axis of the second torsion bars.

18. The micromachined structure of claim 13 wherein the characteristic adjusting means tailors the Q of the principal torsional vibrational mode of the second dynamic member.

19. The micromachined structure of claim 18 wherein tailoring the Q is effected by forming a ridge that projects outward from the first dynamic member and is aligned with the axis of rotation established by the first torsion bars, the ridge being received into a trough formed into a bearing block that is disposed immediately adjacent to the first dynamic member.

20. The micromachined structure of claim 18 wherein tailoring the Q is effected by increasing mass of the first dynamic member near the axis of the first torsion bars about which the first dynamic member may rotate.

21. The micromachined structure of claim 18 wherein tailoring the Q is effected by clamping the first torsion bars to prevent movement of the first dynamic member in the rocking vibratory mode.

22. An integrated, micromachined structure comprising:
a frame-shaped reference member;
a first pair of diametrically opposed, axially aligned torsion bars projecting from the reference member;
a first, frame-shaped first dynamic member that is coupled by the first torsion bars to the reference member to be thereby supported from the reference member for rotation about an axis of the first torsion bars, the first dynamic member having a thickness substantially the same as that of the first pair of torsion bars;
a second pair of diametrically opposed, axially aligned torsion bars projecting from the first dynamic member;
a second dynamic member that is coupled by the second torsion bars to the first dynamic member to be thereby supported from the first dynamic member for rotation about an axis of the second torsion bars;

the reference member, the first and second torsion bars and the first and second dynamic members being all monolithically fabricated from a stress-free semiconductor layer of a silicon substrate; and drive means for imparting oscillatory motion to the second dynamic member about the axis of the second torsion bars.

23. The micromachined structure of claim 22 wherein the first dynamic member includes a reinforcing frame that projects outward from a surface of the first dynamic member thereby stiffening the first dynamic member.

24. The micromachined structure of claim 22 wherein the first dynamic member includes a reinforcement that projects outward from a surface of the first dynamic member adjacent to where the second pair of torsion bars couple to the first dynamic member thereby stiffening the first dynamic member thereabout.

25. The micromachined structure of claim 22 further comprising drive means for imparting oscillatory motion to the first dynamic member about the axis of the first torsion bars.

26. An integrated, micromachined structure comprising:

a frame-shaped reference member;

a first pair of diametrically opposed, axially aligned torsion bars projecting from the reference member;

a first, frame-shaped first dynamic member that is coupled by the first torsion bars to the reference member to be thereby supported from the reference member for rotation about an axis of the first torsion bars, the first dynamic member having a thickness that is only slightly greater than that of the first pair of torsion bars;

a second pair of diametrically opposed, axially aligned torsion bars projecting from the first dynamic member;

a second dynamic member that is coupled by the second torsion bars to the first dynamic member to be thereby supported from the first dynamic member for rotation about an axis of the second torsion bars;

the reference member, the first and second torsion bars and the first and second dynamic members being all monolithically fabricated from a stress-free semiconductor layer of a silicon substrate; and drive means for imparting oscillatory motion to the second dynamic member about the axis of the second torsion bars.

27. The micromachined structure of claim 26 wherein the first dynamic member includes a reinforcing frame that projects outward from a surface of the first dynamic member thereby stiffening the first dynamic member.

28. The micromachined structure of claim 26 wherein the first dynamic member includes a reinforcement that projects outward from a surface of the first dynamic member adjacent to where the second pair of torsion bars couple to the first dynamic member thereby stiffening the first dynamic member thereabout.

29. The micromachined structure of claim 26 further comprising drive means for imparting oscillatory motion to the first dynamic member about the axis of the first torsion bars.

30. In an integrated, micromachined structure that includes:

a frame-shaped reference member;

a pair of diametrically opposed, axially aligned torsion bars projecting from the reference member;

a dynamic member that is coupled by the torsion bars to the reference member to be thereby supported from the reference member for rotation about an axis of the torsion bars; the reference member, the torsion bars and the dynamic member all monolithically fabricated from a stress-free semiconductor layer of a silicon substrate; the dynamic member thus supported within the reference member by the torsion bars exhibiting a plurality of vibrational modes including a principal torsional vibrational mode about the axis of the torsion bars, a vertical shaking vibrational mode, a vertical rocking vibrational mode, a lateral shaking vibrational mode, and a lateral rocking vibrational mode, each such vibrational mode of the dynamic member having characteristics including a vibrational frequency and a Q;

drive means for imparting oscillatory motion to the dynamic member about the axis of the torsion bars; and a gas-filled hermetic enclosure that envelopes the reference member, the torsion bars, the dynamic member and at least a portion of the drive means, the gas which fills the hermetic enclosure having a composition different from that of an atmosphere that surrounds the hermetic enclosure.

31. The micromachined structure of claim 30 wherein the gas filling the hermetic enclosure has a viscosity which is lower than the atmosphere surrounding the hermetic enclosure thereby increasing the Q of the principal torsional vibrational mode of the dynamic member.

32. The micromachined structure of claim 31 wherein the gas filling the hermetic enclosure is selected from a group consisting of hydrogen, propane, ethane, methane or butane.

33. The micromachined structure of claim 30 wherein the drive means for imparting oscillatory motion to the dynamic member operates electrostatically, and the gas filling the hermetic enclosure is an electron capturing gas thereby improving the breakdown voltage of the electrostatically operated drive means.

34. The micromachined structure of claim 33 wherein the gas filling the hermetic enclosure is $SF_6$.

35. In an integrated, micromachined structure that includes:

a frame-shaped reference member;

a pair of diametrically opposed, axially aligned torsion bars projecting from the reference member;

a dynamic member that is coupled by the torsion bars to the reference member to be thereby supported from the reference member for rotation about an axis of the torsion bars; the reference member, the torsion bars and the dynamic member all monolithically fabricated from a stress-free semiconductor layer of a silicon substrate; the dynamic member thus supported within the reference member by the torsion bars exhibiting a plurality of vibrational modes including a principal torsional vibrational mode about the axis of the torsion bars, a vertical shaking vibrational mode, a vertical rocking vibrational mode, a lateral shaking vibrational mode, and a lateral rocking vibrational mode, each such vibrational mode of the dynamic member having characteristics including a vibrational frequency and a Q; and drive means for imparting oscillatory motion to the dynamic member about the axis of the torsion bars;

wherein the improvement comprises:

characteristic adjusting means for tailoring a characteristic of the principal torsional vibrational mode of the dynamic member by altering the dynamic member.

36. The micromachined structure of claim 35 wherein the characteristic adjusting means tailors the vibrational frequency of the principal torsional vibrational mode.

37. The micromachined structure of claim 2 wherein alteration of the vibrational frequency of the principal torsional vibrational mode is effected by removing material from the dynamic member.

38. The micromachined structure of claim 36 wherein tailoring the vibrational frequency of the principal torsional vibrational mode is effected by removing tabs from about a periphery of the dynamic member.

39. The micromachined structure of claim 35 wherein the characteristic adjusting means tailors the Q of the principal torsional vibrational mode.

40. The micromachined structure of claim 39 wherein tailoring the Q is effected by forming the dynamic member with a cross-sectional shape that maximizes inertia of the dynamic member while minimizing viscous drag.

41. In an integrated, micromachined structure that includes:

a frame-shaped reference member;

a pair of diametrically opposed, axially aligned torsion bars projecting from the reference member;

a dynamic member that is coupled by the torsion bars to the reference member to be thereby supported from the reference member for rotation about an axis of the torsion bars; the reference member, the torsion bars and the dynamic member all monolithically fabricated from a stress-free semiconductor layer of a silicon substrate; the dynamic member thus supported within the reference member by the torsion bars exhibiting a plurality of vibrational modes including a principal torsional vibrational mode about the axis of the torsion bars, a vertical shaking vibrational mode, a vertical rocking vibrational mode, a lateral shaking vibrational mode, and a lateral rocking vibrational mode, each such vibrational mode of the dynamic member having characteristics including a vibrational frequency and a Q; and drive means for imparting oscillatory motion to the dynamic member about the axis of the torsion bars;

wherein the improvement comprises:

characteristic adjusting means added to the micromachined structure to mechanically tailor the frequency of the principal torsional vibrational mode of the dynamic member.

42. The micromachined structure of claim 41 wherein tailoring the vibrational frequency of the principal torsional vibrational mode is effected by at least one memory alloy ribbon formed parallel to one of the torsion bars that support the dynamic member, said memory alloy ribbon extending between the dynamic member and the reference member substantially parallel to the immediately adjacent torsion bar, the memory alloy film being processed to establish a controlled stress in the torsion bar.

43. The micromachined structure of claim 41 wherein tailoring of the vibrational frequency of the principal torsional vibrational mode is effected by at least one metallic ribbon formed parallel to one of the torsion bars that support the dynamic member, said metallic ribbon extending between the dynamic member and the reference member substantially parallel to the immediately adjacent torsion bar, an electric current applied to the metallic ribbon establishing a controlled stress in the torsion bar.

44. The micromachined structure of claim 41 wherein tailoring of the vibrational frequency of the principal torsional vibrational mode is effected by an actuator disposed outside of the reference member, application of a voltage across said actuator controllably altering stress in the torsion bars.

45. The micromachined structure of claim 44 wherein the actuator is a piezoelectric actuator.

46. The micromachined structure of claim 44 wherein the actuator is a magneto-restrictive actuator.

* * * * *